US010090263B2

(12) United States Patent
Maruko

(10) Patent No.: US 10,090,263 B2
(45) Date of Patent: Oct. 2, 2018

(54) SEMICONDUCTOR PACKAGE, PRINTED CIRCUIT BOARD SUBSTRATE AND SEMICONDUCTOR DEVICE

(71) Applicant: ROHM CO., LTD., Ukyo-ku, Kyoto (JP)

(72) Inventor: Tsuguto Maruko, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/616,444

(22) Filed: Jun. 7, 2017

(65) Prior Publication Data
US 2017/0271284 A1 Sep. 21, 2017

Related U.S. Application Data

(63) Continuation of application No. 15/222,162, filed on Jul. 28, 2016, now Pat. No. 9,698,111, which is a (Continued)

(30) Foreign Application Priority Data
May 20, 2014 (JP) ................. 2014-103951

(51) Int. Cl.
*H01L 23/52* (2006.01)
*H01L 23/00* (2006.01)
*H01L 23/498* (2006.01)
*H01L 23/31* (2006.01)
*H01L 23/528* (2006.01)
(Continued)

(52) U.S. Cl.
CPC .......... *H01L 24/02* (2013.01); *H01L 23/3114* (2013.01); *H01L 23/49838* (2013.01); (Continued)

(58) Field of Classification Search
CPC ....... H01L 23/528; H01L 24/17; H01L 24/16; H01L 24/02; H01L 23/49838; H01L 23/3114
(Continued)

(56) References Cited

U.S. PATENT DOCUMENTS 6,225,143 B1 5/2001 Rao
6,559,540 B2 5/2003 Kawashima
(Continued)

FOREIGN PATENT DOCUMENTS

JP 2008141019 A 6/2008
JP 2009105297 A 5/2009
(Continued)

OTHER PUBLICATIONS

U.S. Non-Final Office Action corresponding to U.S. Appl. No. 14/716,102, dated Nov. 19, 2015.
(Continued)

*Primary Examiner* — Luan C Thai
(74) *Attorney, Agent, or Firm* — Cantor Colburn LLP

(57) ABSTRACT

A semiconductor package includes: a semiconductor integrated circuit; an interlayer film disposed on the semiconductor integrated circuit; a rewiring layer disposed on the interlayer film; post electrodes disposed on the rewiring layer; a protective layer which is disposed on the interlayer film and covers the rewiring layer and the post electrodes; and a plurality of balls which is respectively disposed on the post electrodes and is connected to the rewiring layer, wherein balls existing on a wiring path of internal wirings connected to inner lands of a plurality of lands, which is arranged on a printed circuit board substrate to face the plurality of balls and is connectable to the plurality of balls, are non-connected to the rewiring layer.

16 Claims, 29 Drawing Sheets

Related U.S. Application Data continuation of application No. 14/716,102, filed on May 19, 2015, now Pat. No. 9,418,957.

(51) Int. Cl.
*H05K 1/18* (2006.01)
*H05K 1/11* (2006.01)

(52) U.S. Cl.
CPC ............ *H01L 23/528* (2013.01); *H01L 24/13* (2013.01); *H01L 24/16* (2013.01); *H01L 24/17* (2013.01); *H05K 1/111* (2013.01); *H05K 1/181* (2013.01); *H01L 2224/02373* (2013.01); *H01L 2224/13024* (2013.01); *H01L 2224/1623* (2013.01); *H01L 2224/16113* (2013.01); *H01L 2224/16227* (2013.01); *H01L 2224/1713* (2013.01); *H01L 2224/17134* (2013.01); *H01L 2224/17179* (2013.01); *H01L 2924/14* (2013.01); *H01L 2924/381* (2013.01); *H05K 2201/09418* (2013.01)

(58) Field of Classification Search
USPC .......................................................... 257/786
See application file for complete search history.

(56) References Cited

U.S. PATENT DOCUMENTS

| | | |
|---|---|---|
| 6,762,495 B1 | 7/2004 | Reyes et al. |
| 6,880,544 B2 | 4/2005 | Hegge |
| 7,005,753 B2 | 2/2006 | Seaman et al. |
| 7,180,011 B1 | 2/2007 | Hall |
| 7,277,298 B2 | 10/2007 | Ohsaka |
| 7,441,222 B2 | 10/2008 | Mathews |
| 8,198,549 B2 | 6/2012 | Saito |
| 8,987,884 B2 | 3/2015 | Chen |
| 2008/0041619 A1* | 2/2008 | Lee .......................... H01L 24/24 174/260 |

FOREIGN PATENT DOCUMENTS

| | | |
|---|---|---|
| JP | 2011091453 A | 5/2011 |
| JP | 2012256935 A | 12/2012 |

OTHER PUBLICATIONS

Notice of Allowance corresponding to U.S. Appl. No. 15/222,162, dated Mar. 1, 2017.

\* cited by examiner

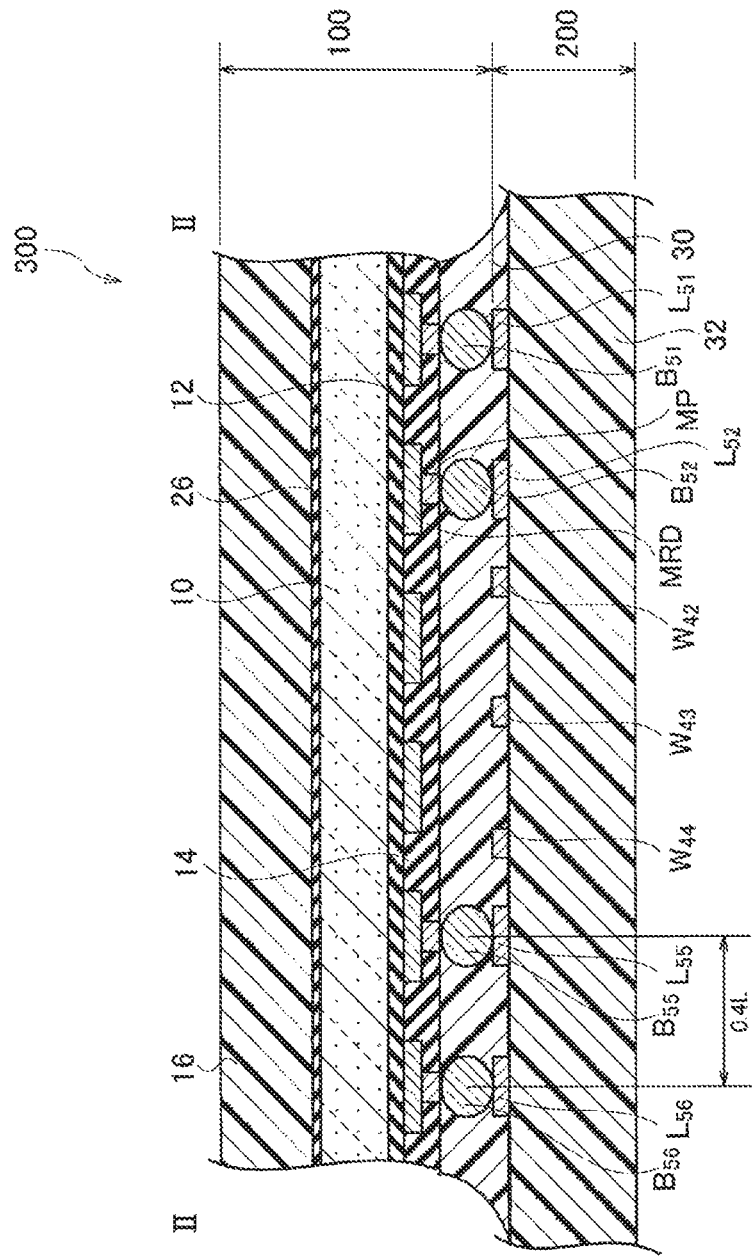

SEMICONDUCTOR PACKAGE, PRINTED CIRCUIT BOARD SUBSTRATE AND SEMICONDUCTOR DEVICE

CROSS-REFERENCE TO RELATED APPLICATION

The present application is a continuation application of U.S. patent application Ser. No. 15/222,162, filed on Jul. 28, 2016. U.S. patent application Ser. No. 15/222,162 was continuation of U.S. patent application Ser. No. 14/716,102, filed on May 19, 2015, the entire contents of which are incorporated herein by reference and priority to which is hereby claimed. Application Ser. No. 14/716,102 claims priority under 35 U.S.C. § 119(a) and 35 U.S.C. § 365(b) to Japanese Application No. 2014-103951, filed on May 20, 2014, the disclosure of which is also incorporated herein by reference.

TECHNICAL FIELD

The present disclosure relates to a semiconductor package, a printed circuit board substrate and a semiconductor device, and more particularly relates to a semiconductor package with a structure where balls are removed or made non-connective for substrate wiring in a grid array package such as BGA (Ball Grid Array)/LGA (Land Grid Array) or the like, a printed circuit board substrate on which the semiconductor package is mounted, and a semiconductor device including the printed circuit board substrate and the semiconductor package mounted on the printed circuit board substrate.

BACKGROUND

As a package structure facilitating miniaturization, high functionality and high performance of semiconductor integrated circuit chips, there has been proposed a grid array package such as WL-CSP (Wafer Level Chip Scale Package) or BGA/LGA.

Typically, when a package such as WL-CSP/BGA/LGA or the like is mounted on a printed circuit board (hereinafter, referred to as a "PCB substrate"), in order to pass wirings between lands corresponding to balls on the PCB substrate, wiring pitches get narrow and the cost of the PCB substrate increases.

In particular, in the case of WL-CSP, the relationship between a chip size and a ball size has an opposite relationship. That is, when the chip size is reduced, the ball pitch is narrowed, which results in increase in the PCB substrate cost. Conversely, when the ball pitch is widened, the chip size is increased, which results in increase in the chip cost.

SUMMARY

The present disclosure provides some embodiments of a semiconductor package which is capable of reducing the chip size and eliminating a need to miniaturize the wiring width on a printed circuit board substrate and can be easily mounted, a printed circuit board substrate on which the semiconductor package is mounted, and a semiconductor device including the printed circuit board substrate and the semiconductor package mounted on the printed circuit board substrate.

According to one embodiment of the present disclosure, there is provided a semiconductor package including: a semiconductor integrated circuit; an interlayer film disposed on the semiconductor integrated circuit; a rewiring layer disposed on the interlayer film; post electrodes disposed on the rewiring layer; a protective layer which is disposed on the interlayer film and covers the rewiring layer and the post electrodes; and a plurality of balls which is respectively disposed on the post electrodes and is connected to the rewiring layer, wherein balls existing on a wiring path of internal wirings connected to inner lands of a plurality of lands, which is arranged on a printed circuit board substrate to face the plurality of balls and is connectable to the plurality of balls, are non-connected to the rewiring layer.

According to another embodiment of the present disclosure, there is provided a semiconductor package including: a semiconductor integrated circuit; an interlayer film disposed on the semiconductor integrated circuit; a rewiring layer disposed on the interlayer film; post electrodes disposed on the rewiring layer; a protective layer which is disposed on the interlayer film and covers the rewiring layer and the post electrodes; and a plurality of balls which is respectively disposed on the post electrodes and is connected to the rewiring layer, wherein balls existing on a wiring path of internal wirings connected to inner lands of a plurality of lands, which is arranged on a printed circuit board substrate to face the plurality of balls and is connectable to the plurality of balls, are removed.

According to still another embodiment of the present disclosure, there is provided a printed circuit board substrate including: an insulating substrate; a plurality of lands which is arranged on the insulating substrate to face a plurality of balls of a semiconductor package and is respectively connectable to the plurality of balls; and wirings which are arranged on the insulating substrate and are respectively connected to the plurality of lands, wherein lands existing on a wiring path of internal wirings, which are connected to lands arranged in an inside on the insulating substrate, are non-connected to a rewiring layer of the semiconductor package.

According to still another embodiment of the present disclosure, there is provided a printed circuit board substrate including: an insulating substrate; a plurality of lands which is arranged on the insulating substrate to face a plurality of balls of a semiconductor package and is respectively connectable to the plurality of balls; and wirings which are arranged on the insulating substrate and are respectively connected to the plurality of lands, wherein lands existing on a wiring path of internal wirings, which are connected to lands arranged in the inside on the insulating substrate, are removed.

According to still another embodiment of the present disclosure, there is provided a semiconductor device including: a semiconductor package including a semiconductor integrated circuit, an interlayer film disposed on the semiconductor integrated circuit, a rewiring layer disposed on the interlayer film, post electrodes disposed on the rewiring layer, a protective layer which is disposed on the interlayer film and covers the rewiring layer and the post electrodes, and a plurality of balls which is respectively disposed on the post electrodes and is connected to the rewiring layer; and a printed circuit board substrate including an insulating substrate, a plurality of lands which is arranged on the insulating substrate to face the plurality of balls and is respectively connectable to the plurality of balls, and wirings which are arranged on the insulating substrate and are respectively connected to the plurality of lands, wherein balls existing on a wiring path of internal wirings, which are connected to lands arranged in the inside on the insulating layer, are non-connected to the rewiring layer.

According to still another embodiment of the present disclosure, there is provided a semiconductor device including: a semiconductor package including a semiconductor integrated circuit, an interlayer film disposed on the semiconductor integrated circuit, a rewiring layer disposed on the interlayer film, post electrodes disposed on the rewiring layer, a protective layer which is disposed on the interlayer film and covers the rewiring layer and the post electrodes, and a plurality of balls which is respectively disposed on the post electrodes and is connected to the rewiring layer; and a printed circuit board substrate including an insulating substrate, a plurality of lands which is arranged on the insulating substrate to face the plurality of balls and is respectively connectable to the plurality of balls, and wirings which are arranged on the insulating substrate and are respectively connected to the plurality of lands, wherein balls existing on a wiring path of internal wirings, which are connected to lands arranged in the inside on the insulating layer, are removed.

BRIEF DESCRIPTION OF THE DRAWINGS

FIG. 16 is a schematic sectional view of a semiconductor device in which a semiconductor package according to a first embodiment is disposed on a PCB substrate, showing a cut section corresponding to line II-II in FIG. 14 (an example where BMPs are removed).

DETAILED DESCRIPTION

Figure 1:
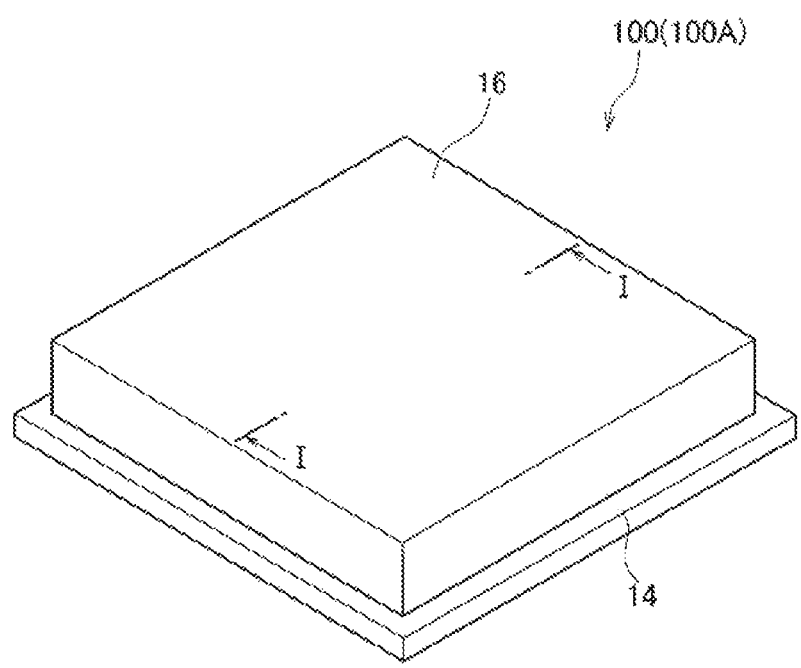
FIG. 1 is a schematic bird's-eye view of a semiconductor package according to the basic technique, which is seen from a front surface side facing a surface on which solder bumps are formed.

Embodiments of the present disclosure will now be described in detail with reference to the drawings. Throughout the drawings, the same or similar elements are denoted by the same or similar reference numerals. It is, however, noted that the drawings are only schematic and the relationship between thickness and planar dimension, a layer thickness ratio and so on are unrealistic. Therefore, specific thicknesses and dimensions should be determined in consideration of the following description. In addition, it is to be understood that the drawings may include different portions of dimensional relations and ratios.

The following embodiments are illustrative of devices and methods for embodying the technical idea of the present disclosure and embodiments of the present disclosure are not intended to limit material, shapes, structures, arrangements and the like to those described below. The embodiments of the present disclosure may be modified in different ways without departing from the scope defined in the claims.

In addition, in the following embodiments, a semiconductor integrated circuit formed on a silicon wafer is also referred to as an LSI (Large Scale Integration), a package in which the LSI is accommodated is referred to as a semiconductor package, and the entire configuration where the semiconductor package is disposed on a PCB substrate is referred to as a semiconductor device. A semiconductor package with an LSI packaged therein may be a grid array package such as WL-CSP, BGA/LGA or the like.

[Basic Technique]
(Semiconductor Package)

Figure 2:
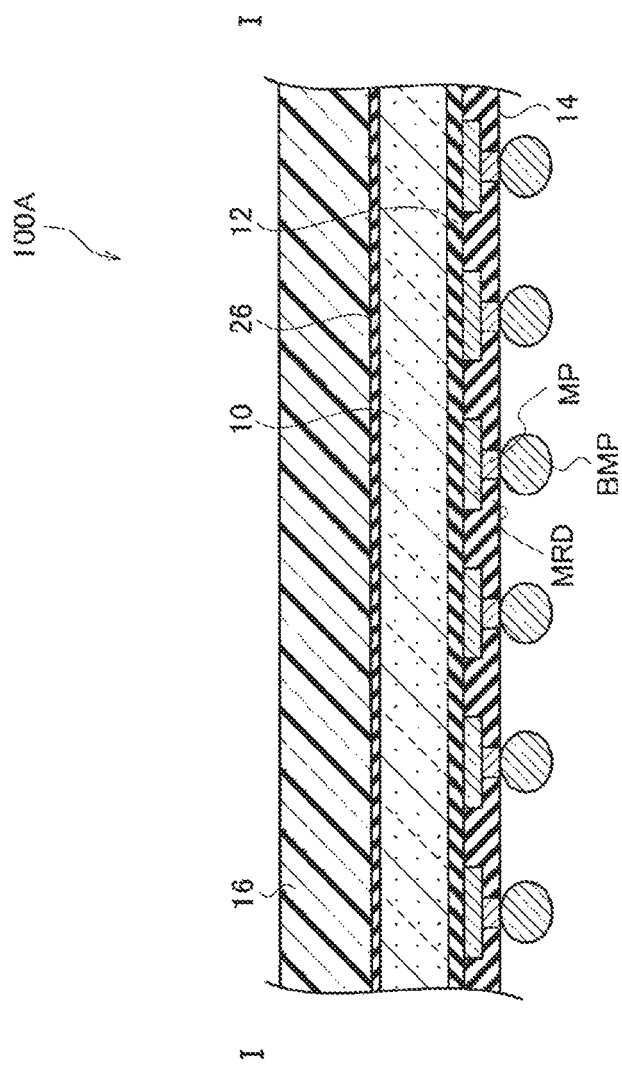
FIG. 2 is a schematic sectional view taken along line I-I in FIG. 1, showing an example of solder bumps formed of BGA.
Figure 3:
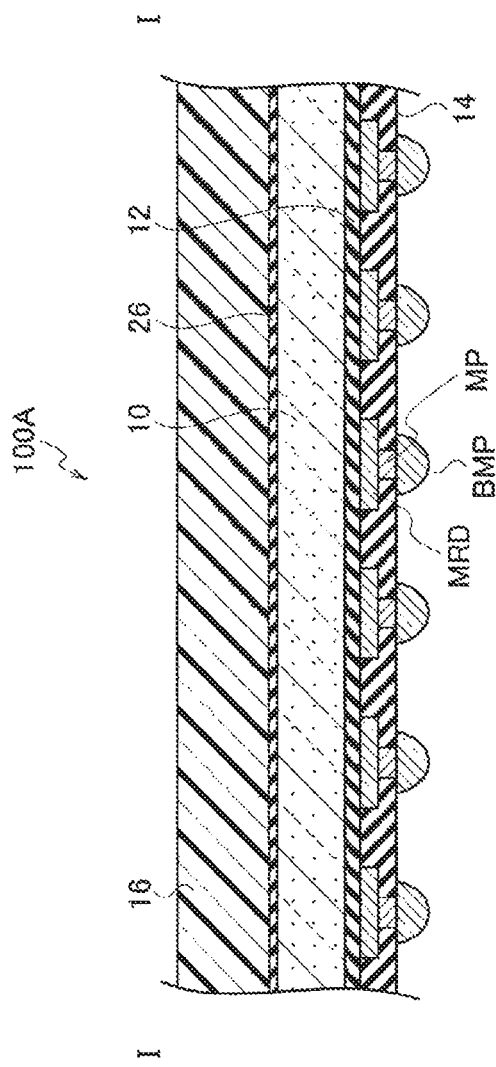
FIG. 3 is a schematic sectional view taken along line I-I in FIG. 1, showing an example of solder bumps formed of LGA.

FIG. 1 is a schematic bird's-eye view of a WL-CSP type semiconductor package 100A according to the basic technique, which is seen from a front surface side facing a surface on which solder bumps BMP are formed. FIG. 2 is a schematic sectional view taken along line I-I in FIG. 1, showing an example of solder bumps BMP formed of BGA. FIG. 3 is a schematic sectional view taken along line I-I in FIG. 1, showing an example of solder bumps BMP formed of LGA.

The WL-CSP type semiconductor package 100A will be described with reference to FIGS. 1 to 3.

The WL-CSP type semiconductor package 100A is a semiconductor package 100A in which terminals and wirings (distinguished from LSI wirings and hereinafter, referred to as a "rewiring layer MRD") are formed before individual LSIs 10 are cut out from a silicon wafer with the LSIs 10 mounted thereon and, thereafter, on which the LSIs 10 cut out from the wafer are mounted.

The main reason for using the WL-CSP type semiconductor package is the minimization of the external size of the LSIs 10 (including thinness, lightness, a degree of freedom of terminal arrangement of the LSIs 10, and so on) and particularly is the point that the external size of the LSIs 10 becomes the external size of the semiconductor package 100A.

As shown in FIGS. 1 to 3, the semiconductor package 100A is substantially rectangular when viewed from top and has a plurality of solder bumps BMP provided as external terminals at predetermined intervals.

The semiconductor package 100A includes a semiconductor integrated circuit (LSI) 10, an interlayer film 12 formed on the front surface of the LSI 10, a rewiring layer MRD formed on the interlayer film 12, a protective layer (interposer) 14 covering the rewiring layer MRD, post electrodes MP formed respectively in openings looking into the rewiring layer MRD of the protective layer 14, and solder bumps (balls) BMP disposed respectively on the post electrodes MP.

Here, the protective layer 14 is provided to cover the rewiring layer MRD and the post electrodes MP.

In addition, a mold resin layer 16 may be disposed, for example, via an LSI protective layer 27, on the rear surface facing the front surface of the LSI 10 on which the protective layer 14 is formed.

The protective layer 14 may be made of, for example, epoxy resin. In addition, the rewiring layer MRD and the post electrodes MP are both formed of a metal layer.

(Semiconductor Device)

Figure 4:
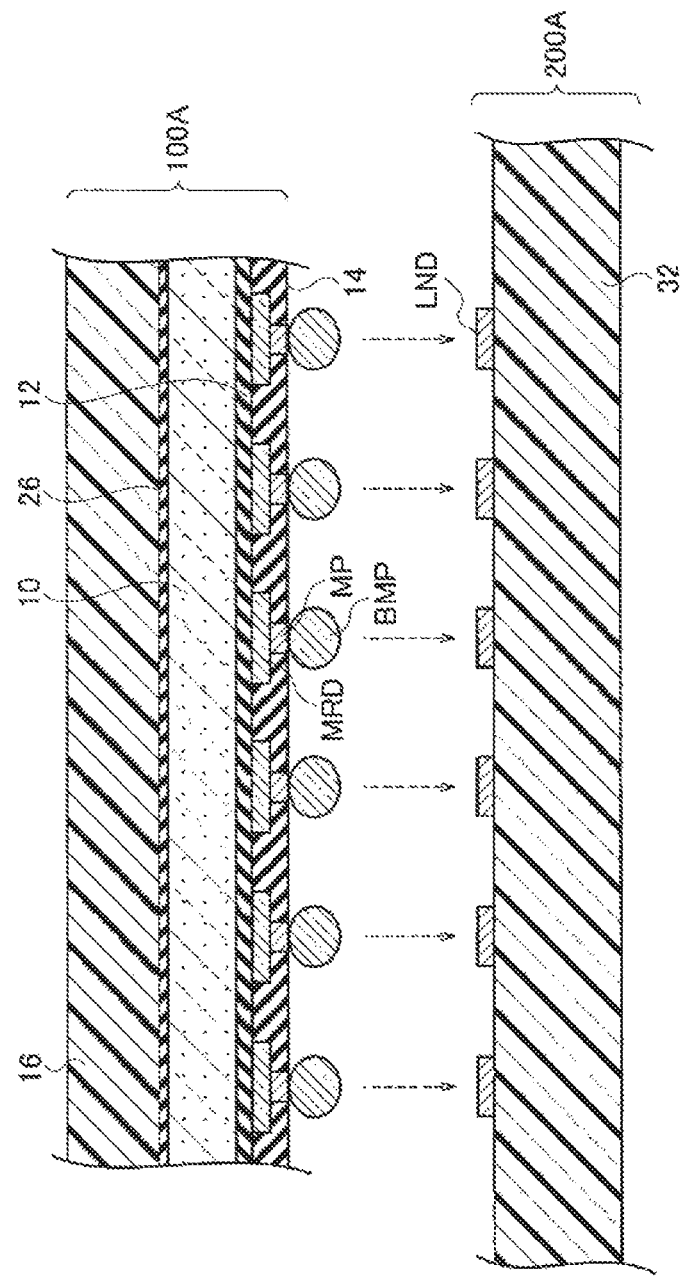
FIG. 4 is a schematic sectional view showing a state of disposing the semiconductor package according to the basic technique on a PCB substrate.

FIG. 4 is a schematic sectional view showing a state of disposing the semiconductor package 100A on a PCB substrate 200A according to the basic technique.

Here, the PCB substrate 200A includes an insulating substrate 32 and lands LND arranged on the insulating substrate 32. The PCB substrate 200A may further include a wiring layer (not shown in FIG. 4) disposed on the insulating substrate 32. The insulating substrate 32 may be made of, for example, epoxy resin. The lands LND are formed of a metal layer.

The semiconductor package 100A is disposed on the PCB substrate 200A in such a manner that the solder bumps (balls) BMP disposed on the post electrodes MP face the lands LND disposed on the PCB substrate 200A.

Figure 5:
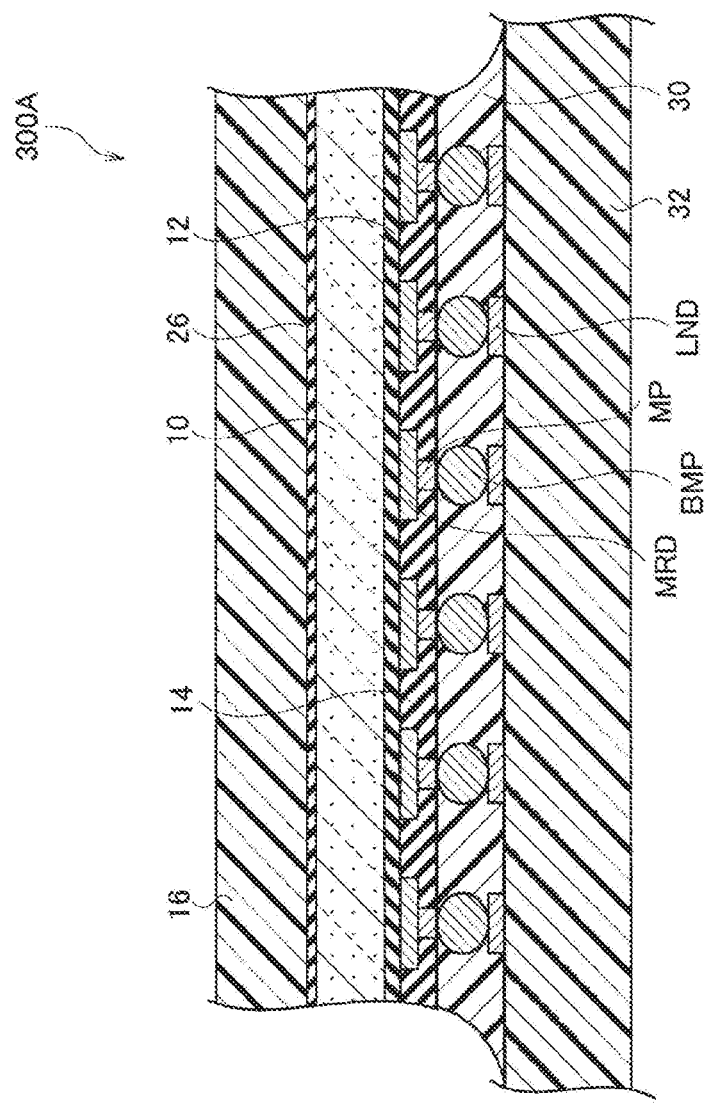
FIG. 5 is a schematic sectional view of a semiconductor device in which the semiconductor package according to the basic technique is disposed on a PCB substrate.
Figure 6:
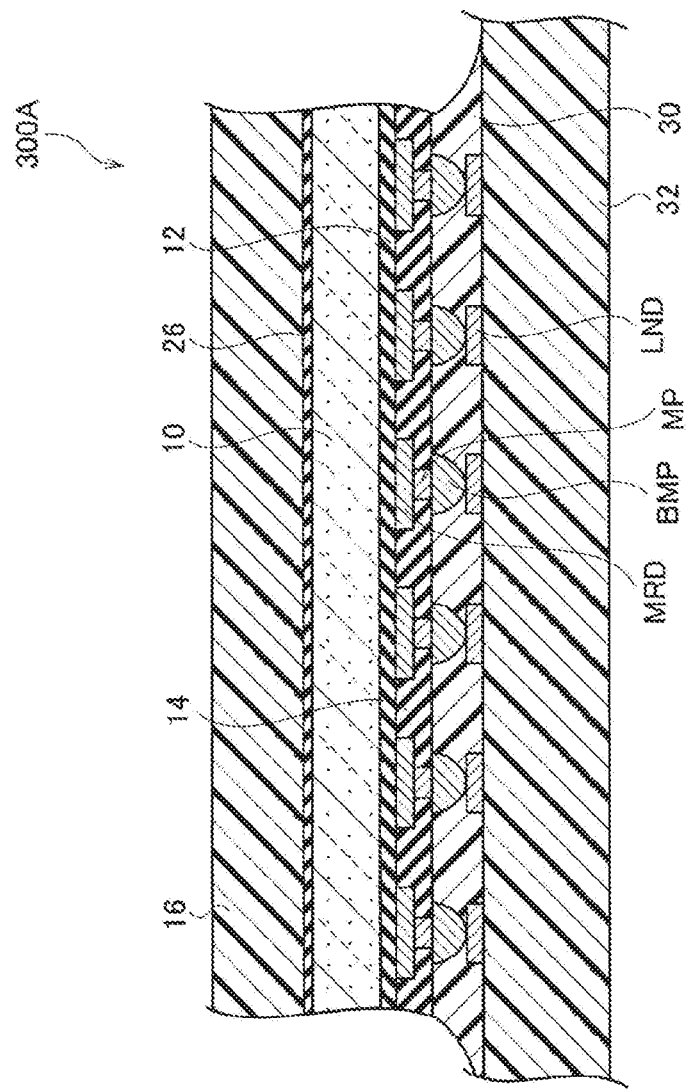
FIG. 6 is a schematic sectional view of another example of the semiconductor device in which the semiconductor package according to the basic technique is disposed on the PCB substrate.

FIG. 5 is a schematic sectional view of a semiconductor device 300A in which the semiconductor package 100A is disposed on the PCB substrate 200A. FIG. 6 is a schematic sectional view of another example of the semiconductor device 300A in which the semiconductor package 100A is disposed on the PCB substrate 200A. FIG. 5 corresponds to a structure example of disposing BGA and FIG. 6 corresponds to a structure example of disposing LGA.

As shown in FIGS. 5 and 6, the solder bumps (balls) BMP and the lands LND are fused together after being subjected to heat treatment and a resin layer 30 for protecting connection portions between the solder bumps (balls) BMP and the lands LND is formed between the semiconductor package 100A and the PCB substrate 200A.

Figure 7:
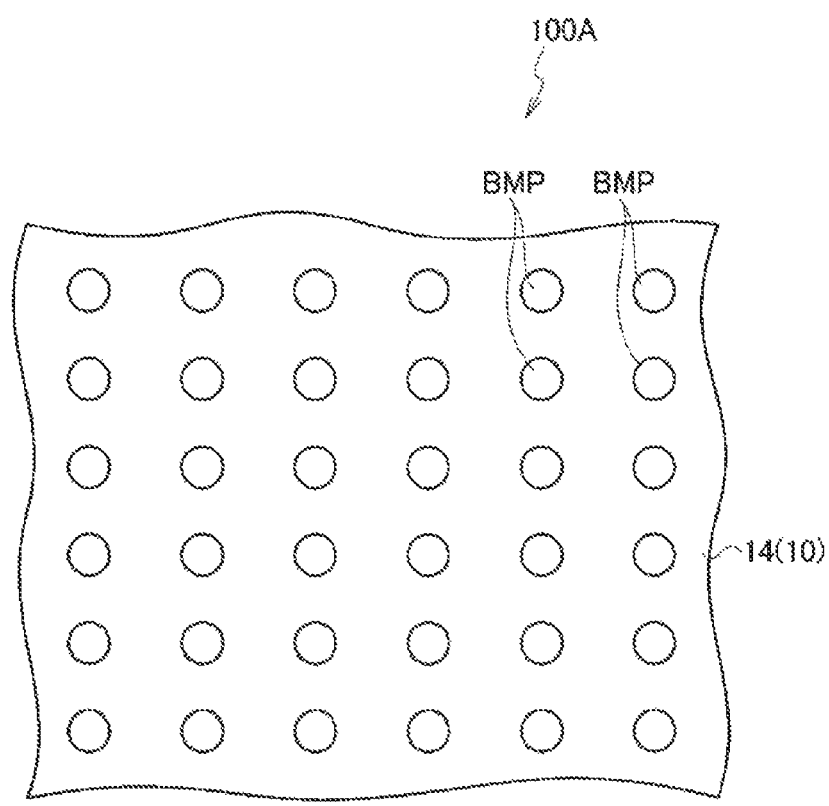
FIG. 7 is a schematic plan view of the semiconductor package according to the basic technique, showing a surface of a side on which solder bumps are formed.
Figure 8:
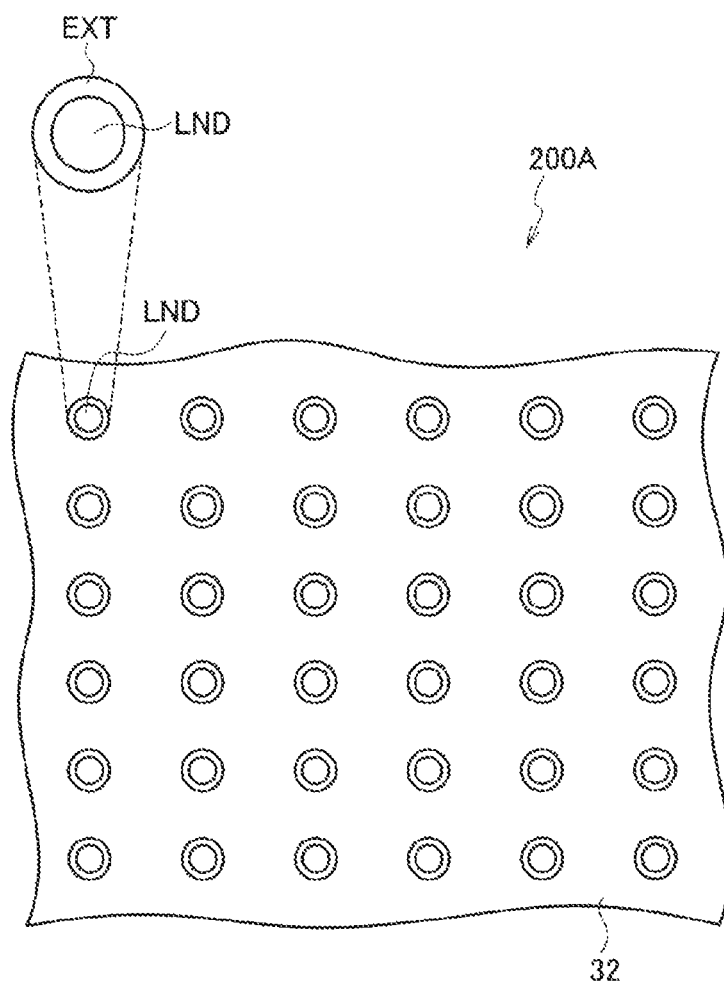
FIG. 8 is a schematic plan view showing a surface of a side in which the lands LND of the PCB substrate mounting the semiconductor package are formed according to the basic technique shown in FIG. 7.

FIG. 7 is a schematic plan view of the semiconductor package 100A according to the basic technique, showing a surface of a side on which the solder bumps BMP are formed. FIG. 8 is a schematic plan view showing a surface of a side in which the lands LND of the PCB substrate 200A mounting the semiconductor package 100A are formed according to the basic technique introduced in FIG. 7. Specifically, an insulating film is formed on the lands LND disposed on the insulating substrate 32 and openings of the insulating substrate 32 are connected to the solder bumps BMP. In FIG. 8, peripheral portions EXT of the lands LND correspond to the insulating film.

Figure 9:
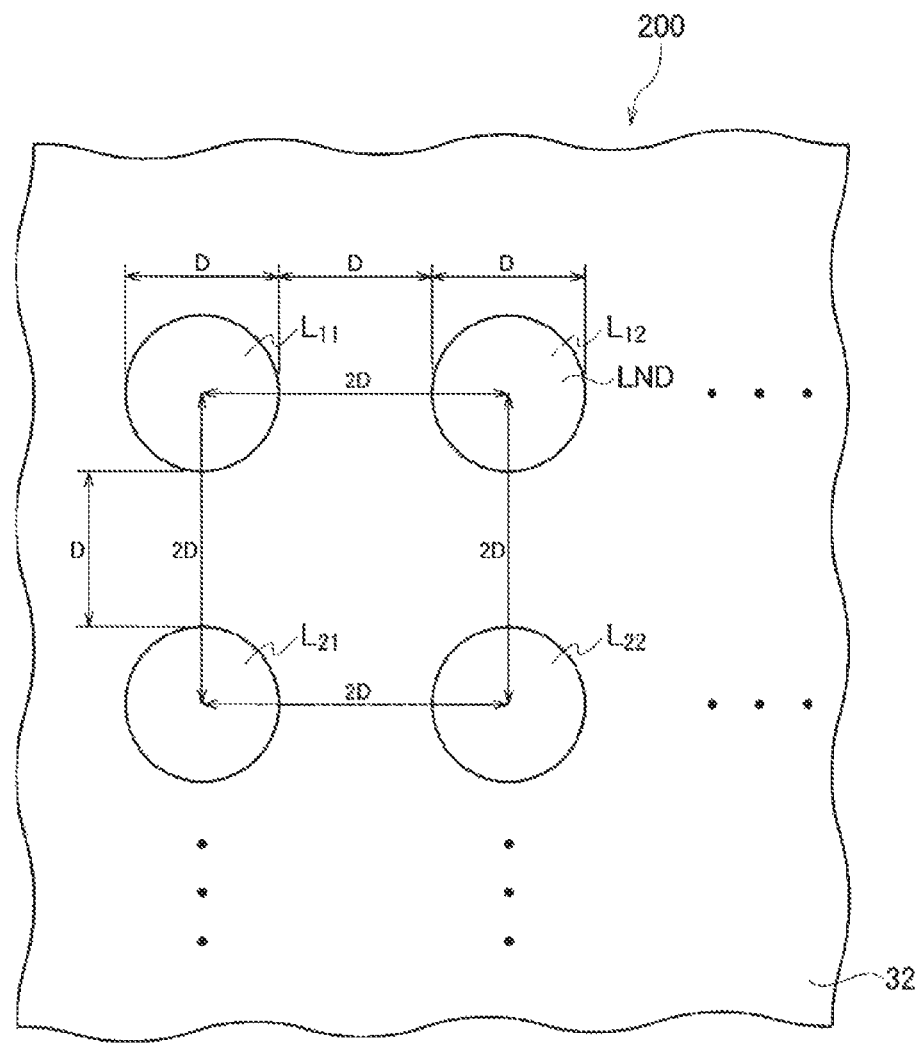
FIG. 9 is a schematic enlarged view for explaining arrangements of lands LND on the PCB substrate.

FIG. 9 is a schematic enlarged view for explaining arrangements of the lands LND on the PCB substrate 200. The lands LND ($L_{11}$, $L_{12}$, . . . , $L_{21}$, $L_{22}$, . . . ) are arranged in the form of a square lattice on the insulating substrate 32 of the PCB substrate 200. Assuming that the diameter of each land LND is D, a distance between adjacent lands LND is D and a pitch between the lands LND arranged in the form of a square lattice is represented by 2D.

Figure 10:
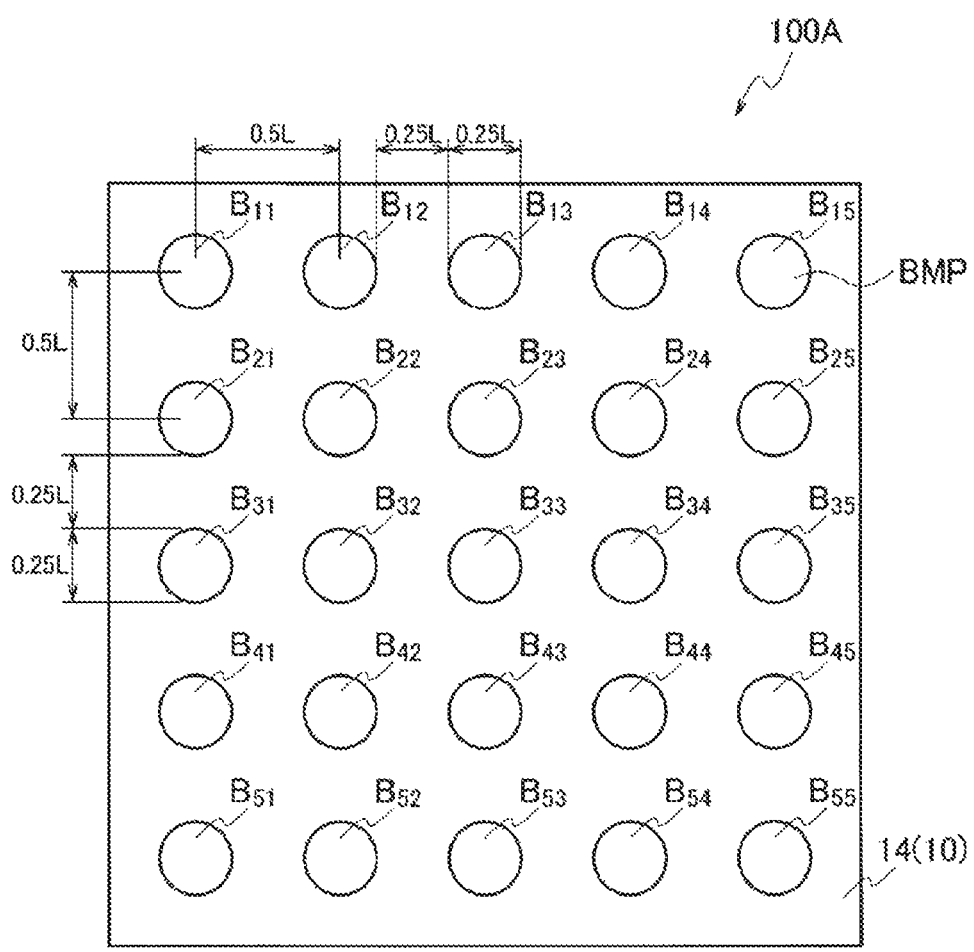
FIG. 10 is a planar pattern configuration view of the semiconductor package according to the basic technique, showing BGA with balls arranged at a 0.5 L pitch on a surface of a side on which solder bumps are formed.

FIG. 10 is a planar pattern configuration view of the semiconductor package 100A according to the basic technique, showing BGA with balls arranged at a 0.5 L pitch on a surface of a side on which the solder bumps BMP are formed.

Balls (solder bumps) $B_{11}$, $B_{12}$, . . . , $B_{54}$ and $B_{55}$ are arranged in the form of a square lattice on a solder bump BMP forming surface in the semiconductor package 100A according to the basic technique. In the example shown in FIG. 10, the diameter of each ball is 0.25 L, a distance between adjacent balls is 0.25 L, and an arrangement pitch between the balls is 0.5 L. Where, L may be set to, for example, 1 mm.

Figure 11:
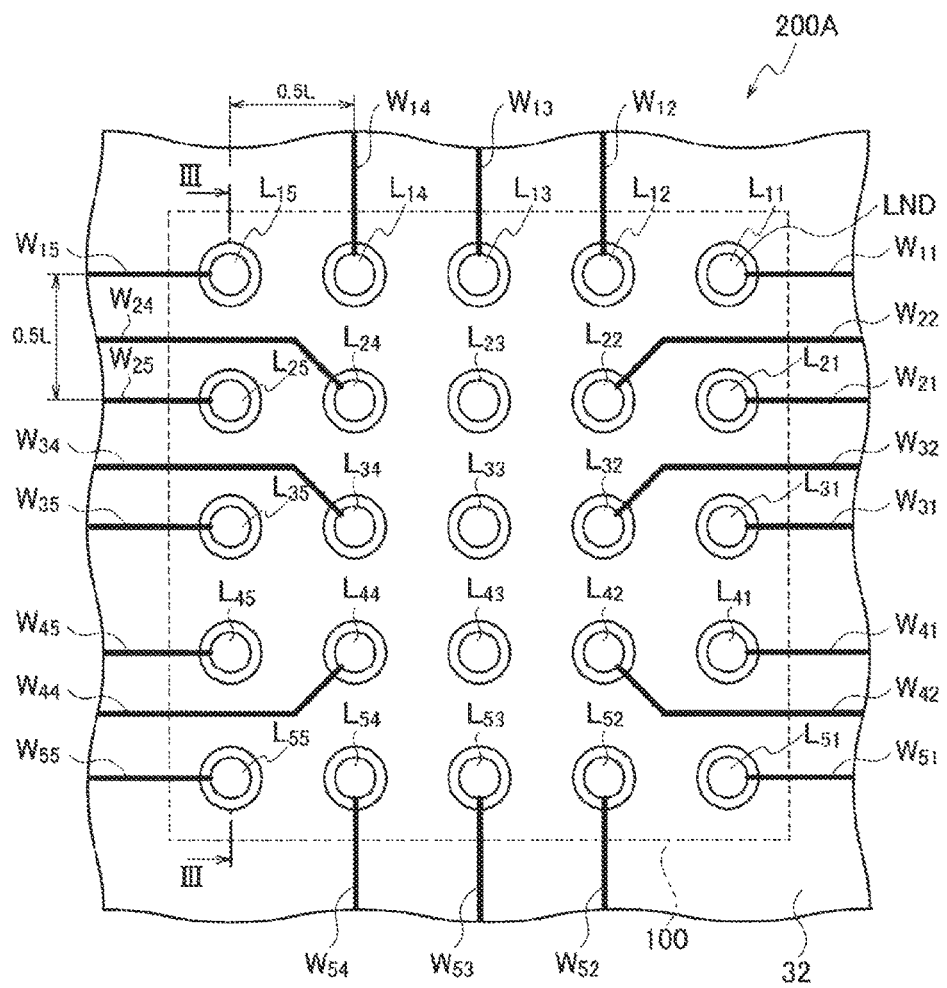
FIG. 11 is a planar pattern configuration view of lands LND arranged at a 0.5 L pitch on a land LND forming surface of the PCB substrate on which the semiconductor package shown in FIG. 10 according to the basic technique is mounted, and wirings W connected to the lands LND.

FIG. 11 is a planar pattern configuration view of lands $L_{11}$, $L_{12}$, . . . , $L_{54}$ and $L_{55}$ arranged at a 0.5 L pitch on a land LND forming surface of the PCB substrate 200A on which the semiconductor package 100A shown in FIG. 10 is mounted, and wirings $W_{11}$, $W_{12}$, . . . , $W_{54}$ and $W_{55}$ connected respectively to the lands $L_{11}$, $L_{12}$, . . . , $L_{54}$ and $L_{55}$.

Figure 12:
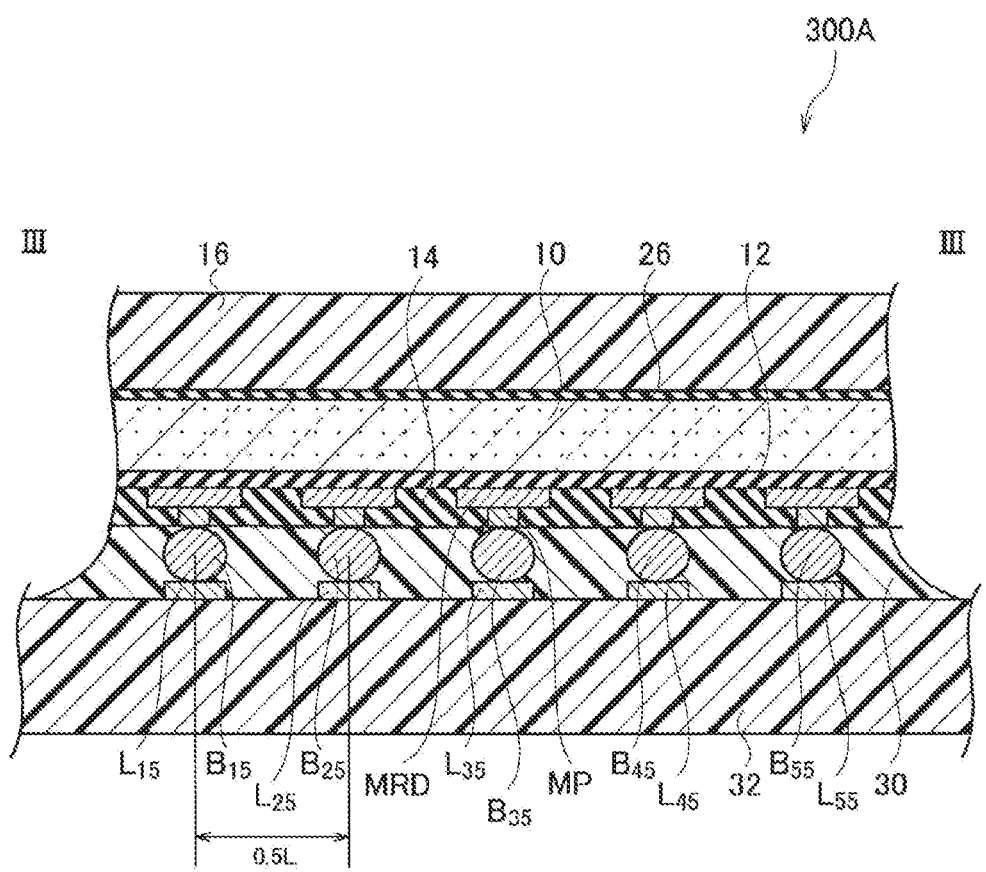
FIG. 12 is a schematic sectional view of a semiconductor device in which a semiconductor package according to the basic technique is disposed on a PCB substrate, showing a cut section corresponding to line III-III in FIG. 11.

FIG. 12 is a schematic sectional view of the semiconductor device 300A in which the semiconductor package 100A according to the basic technique is disposed on the PCB substrate 200A, showing a cut section corresponding to line III-III in FIG. 11. In the semiconductor device 300A in which the semiconductor package 100A is disposed on the PCB substrate 200A, since the semiconductor package 100A is reversely disposed on the PCB substrate 200A, the balls (solder bumps) $B_{11}$, $B_{12}$, . . . , $B_{54}$ and $B_{55}$ are arranged to face the lands $L_{11}$, $L_{12}$, . . . , $L_{54}$ and $L_{55}$ and are respectively connected to the lands $L_{11}$, $L_{12}$, . . . , $L_{54}$ and $L_{55}$.

As shown in FIG. 12, the balls (solder bumps) $B_{11}$, $B_{12}$, . . . , $B_{54}$ and $B_{55}$ are arranged to face the lands $L_{11}$, $L_{12}$, . . . , $L_{54}$ and $L_{55}$ and are respectively connected to the lands $L_{11}$, $L_{12}$, . . . , $L_{54}$ and $L_{55}$.

As shown in FIG. 12, the solder bumps (balls) $B_{15}$, $B_{25}$, . . . , $B_{45}$ and $B_{55}$ and the lands $L_{11}$, $L_{12}$, . . . , $L_{54}$ and $L_{55}$ are respectively fused together by heat treatment. In addition, a resin layer 30 for protecting connection portions between the solder bumps (balls) $B_{15}$, $B_{25}$, . . . , $B_{45}$ and $B_{55}$ and the lands $L_{11}$, $L_{12}$, . . . , $L_{54}$ and $L_{55}$ is formed between the semiconductor package 100A and the PCB substrate 200A.

Embodiment

Figure 13:
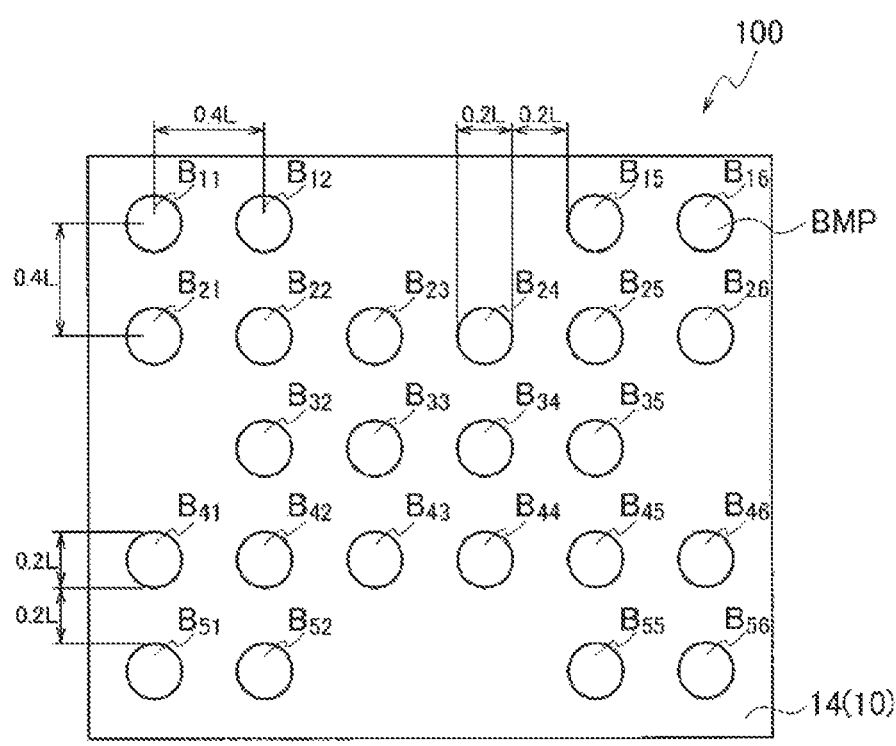
FIG. 13 is a planar pattern configuration view of a semiconductor package according to an embodiment, showing BGA with balls arranged at a 0.4 L pitch on a surface of a side on which solder bumps are formed.

FIG. 13 is a planar pattern configuration view of the semiconductor package 100 according to an embodiment, showing BGA with balls arranged at a 0.4 L pitch on a surface of a side on which solder bumps are formed.

Balls (solder bumps) $B_{11}$, $B_{12}$, . . . , $B_{55}$ and $B_{56}$ are arranged in the form of a lattice on a solder bump BMP forming surface when the protective layer 14 is viewed from top. The lattice may be one of a square lattice, a rectangular lattice, a triangular lattice and a hexagonal lattice. In addition, the arrangement example of FIG. 13 corresponds to an example of a square lattice.

In FIG. 13, of the balls arranged in the periphery, the balls $B_{13}$, $B_{14}$, $B_{31}$, $B_{36}$, $B_{53}$ and $B_{54}$ are removed.

In the example shown in FIG. 13, the diameter of each ball is 0.2 L, a distance between adjacent balls is 0.2 L, and an arrangement pitch between the balls is 0.4 L. Where, L may be set to, for example, 1 mm.

Figure 14:
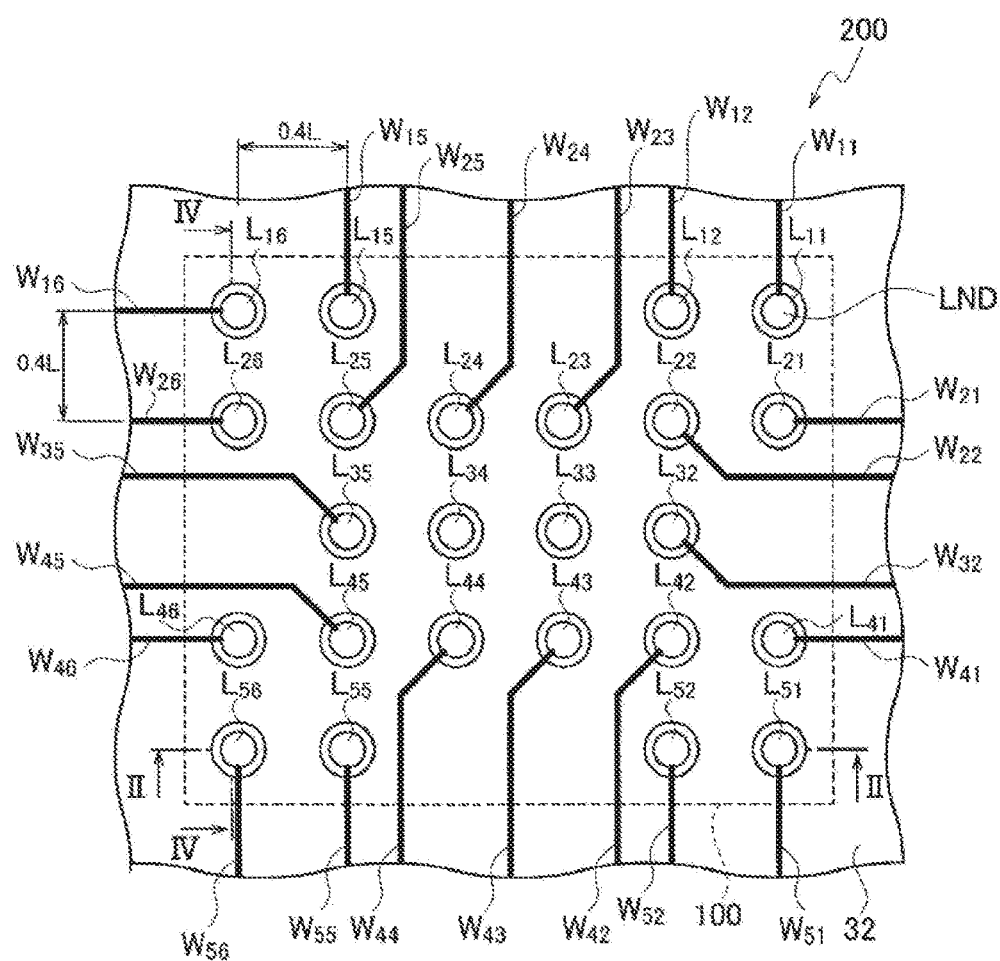
FIG. 14 is a planar pattern configuration view of lands LND arranged at a 0.4 L pitch on a land LND forming surface of the PCB substrate on which the semiconductor package shown in FIG. 13 according to an embodiment is mounted, and wirings W connected respectively to the lands LND.

FIG. 14 is a planar pattern configuration view of lands $L_{11}$, $L_{12}$, . . . , $L_{55}$ and $L_{56}$ arranged at a 0.4 L pitch on a land LND forming surface of the PCB substrate 200 on which the semiconductor package 100 according to an embodiment is mounted, and wirings $W_{11}$, $W_{12}$, . . . , $W_{55}$ and $W_{56}$ connected respectively to the lands $L_{11}$, $L_{12}$, . . . , $L_{55}$ and $L_{56}$.

Here, of the balls arranged in the periphery, the balls $B_{13}$, $B_{14}$, $B_{31}$, $B_{36}$, $B_{53}$ and $B_{54}$ are removed. That is, lands $L_{13}$, $L_{14}$, $L_{31}$, $L_{36}$, $L_{53}$ and $L_{54}$ corresponding to the removed balls $B_{13}$, $B_{14}$, $B_{31}$, $B_{36}$, $B_{53}$ and $B_{54}$ are removed.

As shown in FIG. 14, a space of the removed lands $L_{13}$ and $L_{14}$ is used as a space for arrangement of the wiring $W_{25}$, $W_{24}$ and $W_{23}$, a space of the removed land $L_{36}$ is used as a space for arrangement of the wiring $W_{35}$ and $W_{45}$, and a space of the removed lands $L_{54}$ and $L_{53}$ is used as a space for arrangement of the wiring $W_{44}$, $W_{43}$ and $W_{42}$.

In some embodiments, balls arranged in corners and in the central portion of the solder bump BMP forming surface of the semiconductor package 100 and lands facing the balls may not be removed in order to secure connectivity between the semiconductor package 100 and the PCB substrate 200.

That is, as shown in FIGS. 13 and 14, in some embodiments, lands $L_{11}$, $L_{16}$, $L_{51}$ and $L_{56}$ arranged in the corners of the semiconductor device 300, their corresponding balls $B_{11}$, $B_{16}$, $B_{51}$ and $B_{56}$, lands $L_{33}$ and $L_{34}$ arranged in the central portion, and their corresponding balls $B_{33}$ and $B_{34}$ may be left in order to secure connectivity between the semiconductor package 100 and the PCB substrate 200.

In addition, for the purpose of passing wirings of balls arranged in the inside and their corresponding lands, the lands $L_{13}$, $L_{14}$, $L_{31}$, $L_{36}$, $L_{53}$ and $L_{54}$ arranged in the periphery of the chip are removed. In addition, their corresponding balls $B_{13}$, $B_{14}$, $B_{31}$, $B_{36}$, $B_{53}$ and $B_{54}$ are also removed. In addition, the balls $B_{13}$, $B_{14}$, $B_{31}$, $B_{36}$, $B_{53}$ and $B_{54}$ corresponding to the removed lands $L_{13}$, $L_{14}$, $L_{31}$, $L_{36}$, $L_{53}$ and $L_{54}$ may have a non-contact (NC) configuration.

FIG. 16 is a schematic sectional view of the semiconductor device 300 in which the semiconductor package 100 according to an embodiment is disposed on the PCB substrate 200, showing a cut section corresponding to line II-II in FIG. 14. As shown in FIG. 16, balls $B_{53}$ and $B_{54}$ are removed. In the example shown in FIG. 16, lands $L_{53}$ and $L_{54}$ corresponding to the balls $B_{53}$ and $B_{54}$ are also removed.

Figure 15:
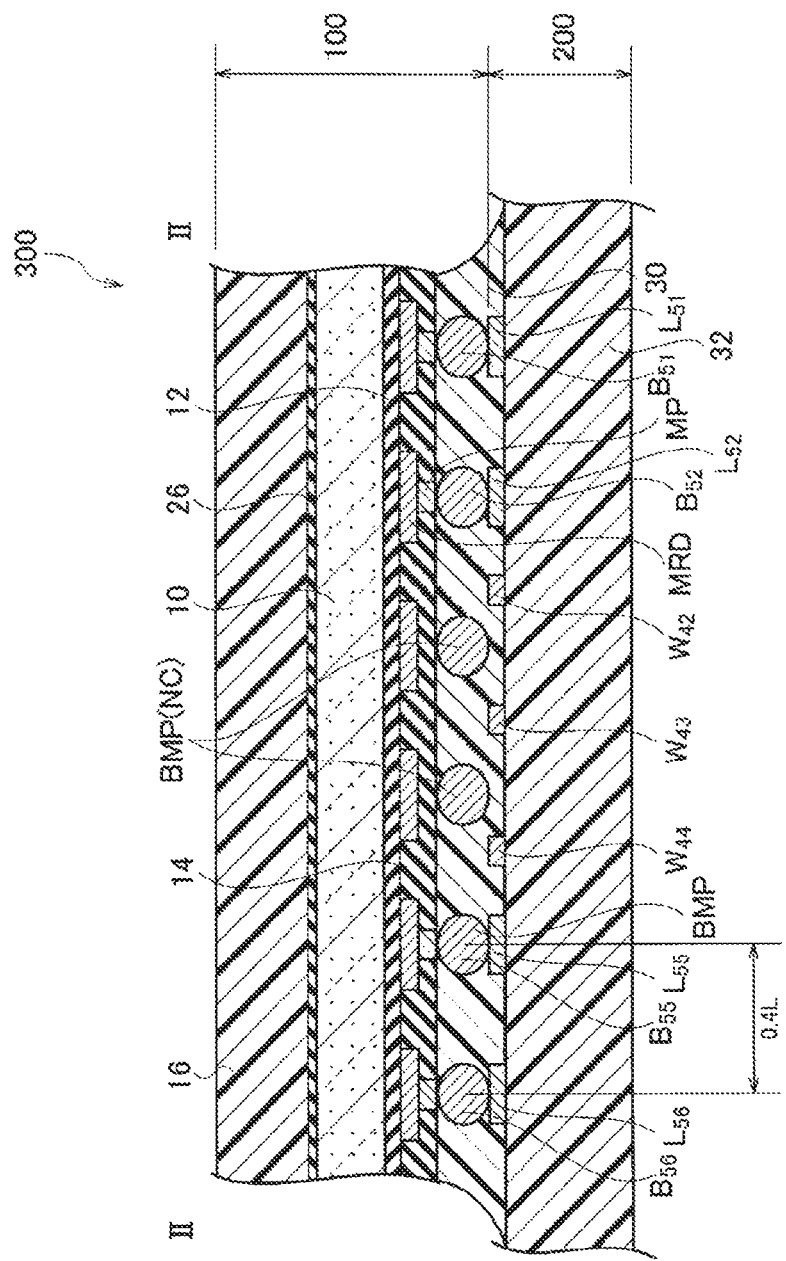
FIG. 15 is a schematic sectional view of a semiconductor device in which a semiconductor package according to an embodiment is mounted on a PCB substrate, showing a cut section corresponding to line II-II in FIG. 14 (an example where balls BMP (NC) are non-connected to a rewiring layer MRD).

As a modification, FIG. 15 is a schematic sectional view of a cut section corresponding to line II-II in FIG. 14. In the example shown in FIG. 15, the balls $B_{53}$ and $B_{54}$ are shown as BMP (NC) non-connected to the rewiring layer MRD. In the example shown in FIG. 15, the lands $L_{53}$ and $L_{54}$ corresponding to the balls $B_{53}$ and $B_{54}$ are also removed. On the other hand, the lands $L_{53}$ and $L_{54}$ corresponding to the balls $B_{53}$ and $B_{54}$ may be left on the insulating substrate 32 and may be used as a part of the wirings.

As shown in FIGS. 13 to 16, the semiconductor package 100 according to the embodiment includes a semiconductor integrated circuit 10, an interlayer film 12 formed on the semiconductor integrated circuit 10, a rewiring layer MRD formed on the interlayer film 12, post electrodes MP formed on the rewiring layer MRD, a protective layer 14 which is formed on the interlayer film 12 and covers the rewiring layer MRD and the post electrodes MP, and balls BMP which are disposed respectively on the post electrodes MP and are connected to the rewiring layer MRD.

In addition, balls BMP ($B_{13}$, $B_{14}$, $B_{31}$, $B_{36}$, $B_{53}$ and $B_{54}$) existing on a wiring path of internal wirings $W_{22}$, $W_{23}$, $W_{24}$, $W_{25}$, $W_{32}$, $W_{35}$, $W_{42}$, $W_{43}$, $W_{44}$ and $W_{45}$ that are connected to the inner lands LND ($L_{22}$, $L_{23}$, $L_{24}$, $L_{25}$, $L_{32}$, $L_{35}$, $L_{42}$, $L_{43}$, $L_{44}$ and $L_{45}$) of a plurality of lands LND is arranged on the PCB substrate 200 to face a plurality of balls BMP, and the plurality of balls BMP may also be non-connected to the rewiring layer MRD.

Here, as shown in FIG. 15, the protective layer 14 is interposed between the rewiring layer MRD and the balls BMP ($B_{13}$, $B_{14}$, $B_{31}$, $B_{36}$, $B_{53}$ and $B_{54}$) non-connected to the rewiring layer MRD, so as to make a non-connection therebetween.

In addition, as shown in FIG. 16, the balls BMP ($B_{13}$, $B_{14}$, $B_{31}$, $B_{36}$, $B_{53}$ and $B_{54}$) existing on the wiring path of the internal wirings $W_{22}$, $W_{23}$, $W_{24}$, $W_{25}$, $W_{32}$, $W_{35}$, $W_{42}$, $W_{43}$, $W_{44}$ and $W_{45}$ connected to the inner lands LND ($L_{22}$, $L_{23}$, $L_{24}$, $L_{25}$, $L_{32}$, $L_{35}$, $L_{42}$, $L_{43}$, $L_{44}$ and $L_{45}$) of the plurality of lands LND which is arranged on the PCB substrate 200 to face the plurality of balls BMP and can be connected to the plurality of balls BMP may be removed.

As shown in FIGS. 13 to 16, the PCB substrate 200 according to the embodiment includes an insulating substrate 32, a plurality of lands $L_{11}$, $L_{12}$, . . . , $L_{55}$ and $L_{56}$ which are arranged on the insulating substrate 32 to face a plurality of balls $B_{11}$, $B_{12}$, . . . , $B_{55}$ and $B_{56}$ of the semiconductor package 100 and can be respectively connected to the plurality of balls $B_{11}$, $B_{12}$, . . . , $B_{55}$ and $B_{56}$, and wirings $W_{11}$, $W_{12}$, . . . , $W_{55}$ and $W_{56}$ which are arranged on the insulating substrate 32 and are respectively connected to the plurality of lands $L_{11}$, $L_{12}$, . . . , $L_{55}$ and $L_{56}$.

In addition, as shown in FIGS. 13 to 16, the lands LND ($L_{13}$, $L_{14}$, $L_{31}$, $L_{36}$, $L_{53}$ and $L_{54}$) existing on a wiring path of internal wirings $W_{22}$, $W_{23}$, $W_{24}$, $W_{25}$, $W_{32}$, $W_{35}$, $W_{42}$, $W_{43}$, $W_{44}$ and $W_{45}$ connected to lands LND ($L_{22}$, $L_{23}$, $L_{24}$, $L_{25}$, $L_{32}$, $L_{35}$, $L_{42}$, $L_{43}$, $L_{44}$ and $L_{45}$) which are arranged in the inside on the insulating substrate 32 are removed.

In addition, the lands LND ($L_{13}$, $L_{14}$, $L_{31}$, $L_{36}$, $L_{53}$ and $L_{54}$) may be used as non-contact lands LND (NC) by being non-connected to the rewiring layer MRD of the semiconductor package 100. In this case, the lands LND (NC) ($L_{13}$, $L_{14}$, $L_{31}$, $L_{36}$, $L_{53}$ and $L_{54}$) may be left on the insulating substrate 32 and may be used as a part of wirings.

The lands $L_{11}$, $L_{12}$, . . . , $L_{55}$ and $L_{56}$ are arranged in the form of a lattice when the insulating substrate 32 is viewed from top. The lattice may be one of a square lattice, a rectangular lattice, a triangular lattice and a hexagonal lattice.

In some embodiments, lands $L_{11}$, $L_{16}$, $L_{51}$ and $L_{56}$ arranged in corners of the insulating substrate 32 and lands $L_{33}$ and $L_{34}$ arranged in the central portion may be left in order to secure connectivity with the semiconductor package 100.

As shown in FIGS. 13 to 16, the semiconductor device 300 according to the embodiment includes a semiconductor package 100 including a semiconductor integrated circuit 10, an interlayer film 12 formed on the semiconductor integrated circuit 10, a rewiring layer MRD formed on the interlayer film 12, post electrodes MP formed on the rewiring layer MRD, a protective layer 14 which is formed on the interlayer film 12 and covers the rewiring layer MRD and the post electrodes MP, and balls BMP which are disposed respectively on the post electrodes MP and are connected to the rewiring layer MRD; and a PCB substrate 200 including an insulating substrate 32, lands LND which are arranged on the insulating substrate 32 to face balls BMP and can be connected to the balls BMP, and wirings W which are arranged on the insulating substrate 32 and are connected to the lands LND.

Here, the balls BMP ($B_{13}$, $B_{14}$, $B_{31}$, $B_{36}$, $B_{53}$ and $B_{54}$) existing on a wiring path of internal wirings $W_{22}$, $W_{23}$, $W_{24}$, $W_{25}$, $W_{32}$, $W_{35}$, $W_{42}$, $W_{43}$, $W_{44}$ and $W_{45}$ that are connected to lands LND ($L_{22}$, $L_{23}$, $L_{24}$, $L_{25}$, $L_{32}$, $L_{35}$, $L_{42}$, $L_{43}$, $L_{44}$ and $L_{45}$) are arranged in the inside of the insulating substrate 32 may be removed or be non-connected to the rewiring layer MRD.

Here, as shown in FIG. 15, the protective layer 14 is interposed between the rewiring layer MRD and the balls BMP ($B_{13}$, $B_{14}$, $B_{31}$, $B_{36}$, $B_{53}$ and $B_{54}$) non-connected to the rewiring layer MRD, making non-connection therebetween.

In addition, in some embodiments, balls arranged in the corners and the central portion of the semiconductor package 100 may be left in order to secure connectivity with the PCB substrate.

The semiconductor package 100 may be a wafer level chip size package.

Figure 17A:
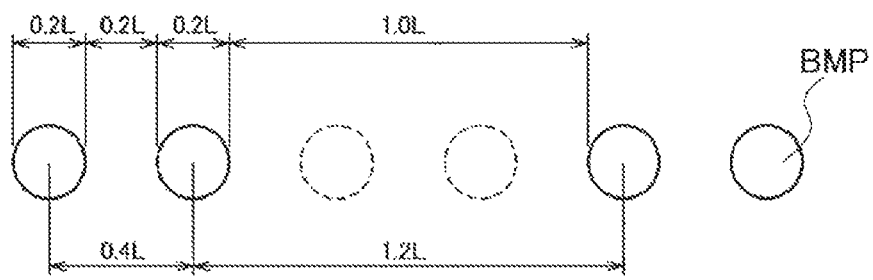
FIG. 17A is a schematic view for explaining a pitch length of the balls corresponding to FIG. 15 or 16 and FIG. 17B is a schematic view for explaining a pitch length of lands LND and wirings corresponding to FIG. 17A.
Figure 17B:
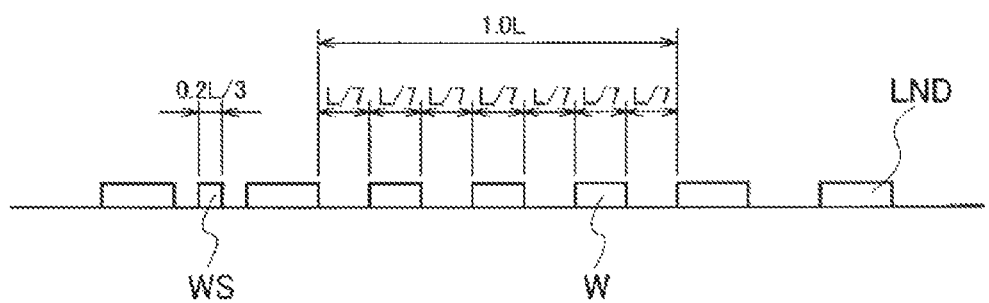

FIG. 17A is a schematic view for explaining a pitch length of the balls corresponding to FIG. 15 or 16 and FIG. 17B is a schematic view for explaining a pitch length of the lands LND and the wirings W and WS corresponding to FIG. 17A.

Two BMP portions indicated by a broken line in FIG. 17A indicates that they are BMP(NC) in non-contact with the rewiring layer MRD or are removed. For example, the two BMP portions indicated by the broken line correspond to the removed balls $B_{13}$ and $B_{14}$ or the removed balls $B_{53}$ and $B_{54}$ in FIG. 13.

In this manner, when the two BMP portions indicated by the broken line have a space of 1.0 L between BMPs in both sides and three wirings W pass therebetween, line-and-spaces of L/7 are obtained as shown in FIG. 17B. On the other hand, as shown as a comparative example in the left side of FIG. 17B, when one thin wiring WS passes in a space of 0.2 L between lands LND, a line-and-space of 0.2 L/3 is obtained. That is, the wiring width is about 2.1 times and there is no need to miniaturize the wiring width on the PCB substrate.

Figure 18:
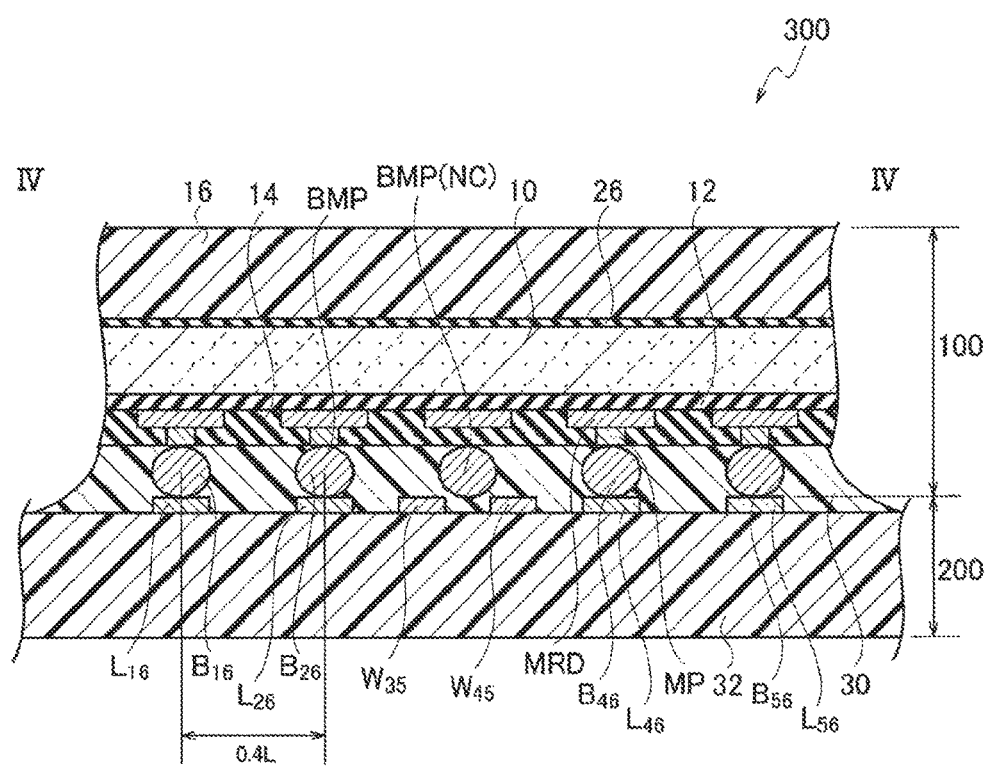
FIG. 18 is a schematic sectional view of a semiconductor device in which a semiconductor package according to an embodiment is mounted on a PCB substrate, showing a cut section corresponding to line IV-IV in FIG. 14 (an example where balls BMP (NC) are non-connected to a rewiring layer MRD).

FIG. 18 is a schematic sectional view of the semiconductor device 300 in which the semiconductor package according to an embodiment is disposed on the PCB substrate, showing a cut section corresponding to line IV-IV in FIG. 14. An example where a ball corresponding to the ball $B_{36}$ has BMP(NC) in non-contact with the rewiring layer MRD is shown in FIG. 18. The land $L_{36}$ corresponding to the ball $B_{36}$ is removed.

Figure 19:
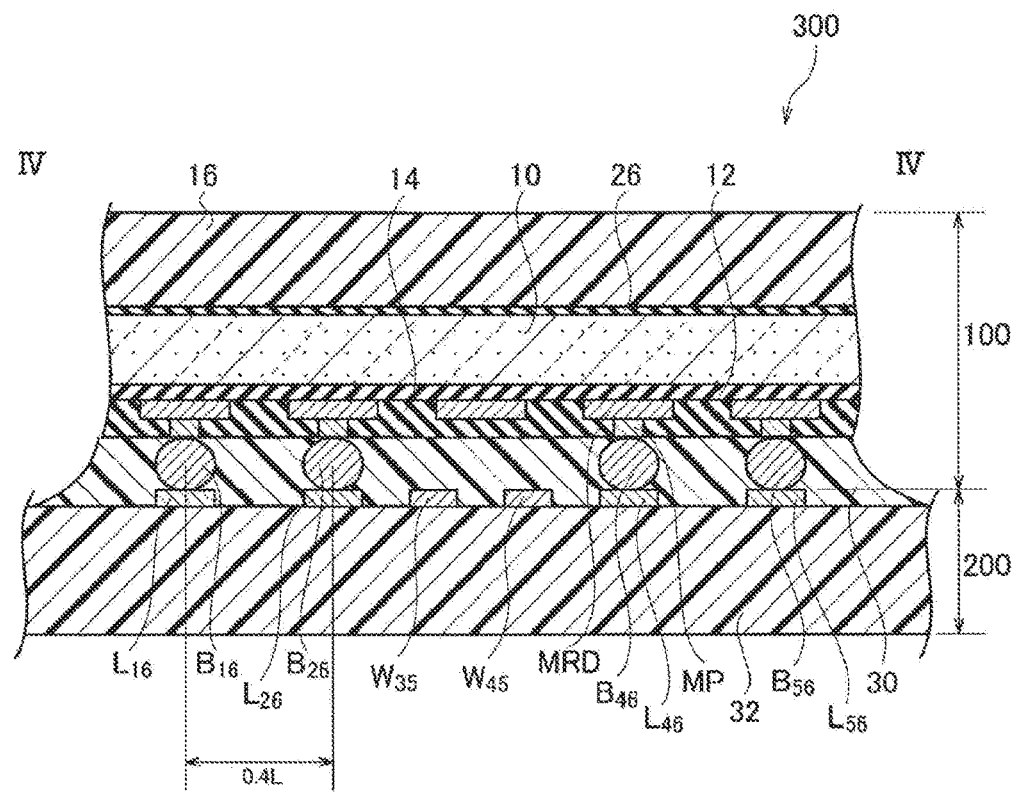
FIG. 19 is a schematic sectional view of a semiconductor device in which a semiconductor package according to an embodiment is mounted on a PCB substrate, showing a cut section corresponding to line IV-IV in FIG. 14 (an example where BMPs are removed).

FIG. 19 is a schematic sectional view of the semiconductor device 300 in which the semiconductor package according to an embodiment is disposed on the PCB substrate, showing a cut section corresponding to line IV-IV in FIG. 14. As shown in FIG. 19, a ball corresponding to the ball $B_{36}$ is removed. The land $L_{36}$ corresponding to the ball $B_{36}$ is also removed.

FIG. 19 is a schematic sectional view of the semiconductor device 300 in which the semiconductor package 100 according to an embodiment is disposed on the PCB substrate 200, showing a cut section corresponding to line IV-IV in FIG. 14. As shown in FIG. 19, the ball $B_{36}$ is removed. The land $L_{36}$ corresponding to the ball $B_{36}$ is also removed in the example shown in FIG. 19.

As a modification, FIG. 18 is a schematic sectional view of a cut section corresponding to line II-II in FIG. 14. In the example shown in FIG. 18, the ball $B_{36}$ is shown as BMP(NC) non-connected to the rewiring layer MRD. In the example shown in FIG. 18, the land $L_{36}$ corresponding to the ball $B_{36}$ is also removed. On the other hand, the land $L_{36}$ corresponding to the ball $B_{36}$ may be left on the insulating substrate 32 and may be used as a part of the wirings.

Figure 20A:
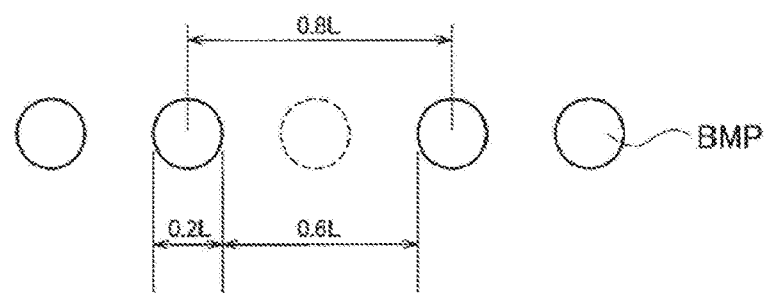
FIG. 20A is a schematic view for explaining a pitch length of the balls corresponding to FIG. 18 or 19 and FIG. 20B is a schematic view for explaining a pitch length of lands LND and wirings corresponding to FIG. 20A.
Figure 20B:
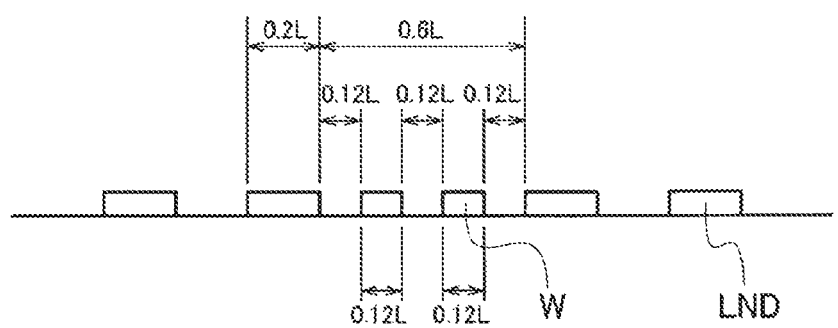

FIG. 20A is a schematic view for explaining a pitch length of the balls corresponding to FIG. 18 or FIG. 19 and FIG. 20B is a schematic view for explaining a pitch length of the lands LND and the wirings W corresponding to FIG. 20A.

One BMP portion indicated by a broken line in FIG. 20A indicates that it is BMP(NC) in non-contact with the rewiring layer MRD or is removed. For example, the one BMP portion indicated by the broken line corresponds to the removed ball $B_{31}$ or $B_{36}$ in FIG. 13.

In this manner, when one BMP portion indicated by the broken line has a space of 0.6 L between BMPs in both sides and two wirings W pass therebetween, line-and-spaces of 0.12 L are obtained as shown in FIG. 20B. On the other hand, as shown as a comparative example in the left side of FIG. 20B, when one thin wiring WS passes in a space of 0.2 L between lands LND, a line-and-space of 0.2 L/3 is obtained. That is, the wiring width is about 1.8 times and there is no need to miniaturize the wiring width on the PCB substrate.

Figure 21:
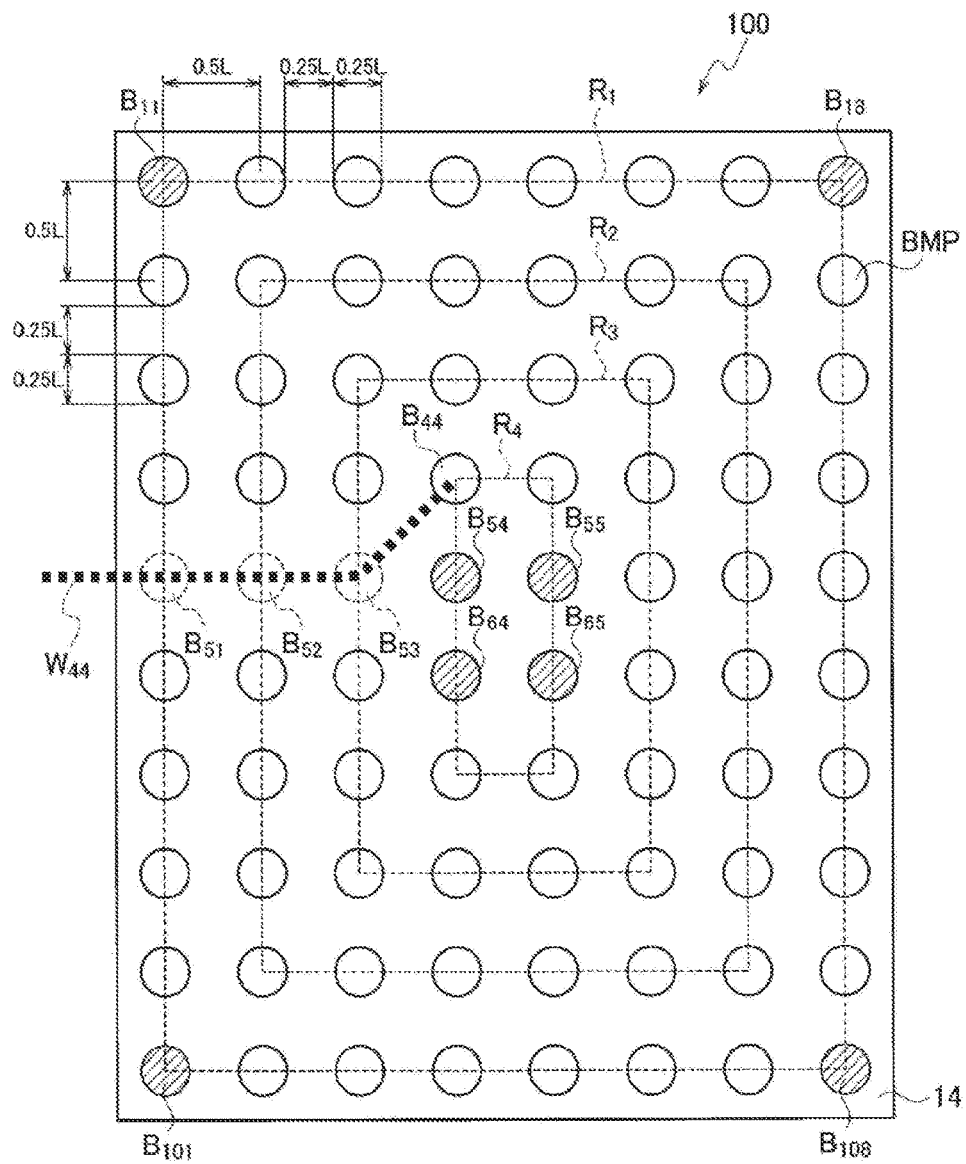
FIG. 21 is a planar pattern configuration view of a semiconductor package according to an embodiment, showing BGA in which 10×8 solder bumps BMP each having the diameter D of 0.25 L are arranged at a 2D (=0.5 L) pitch on a surface of a side on which the solder bumps are formed.
Figure 22:
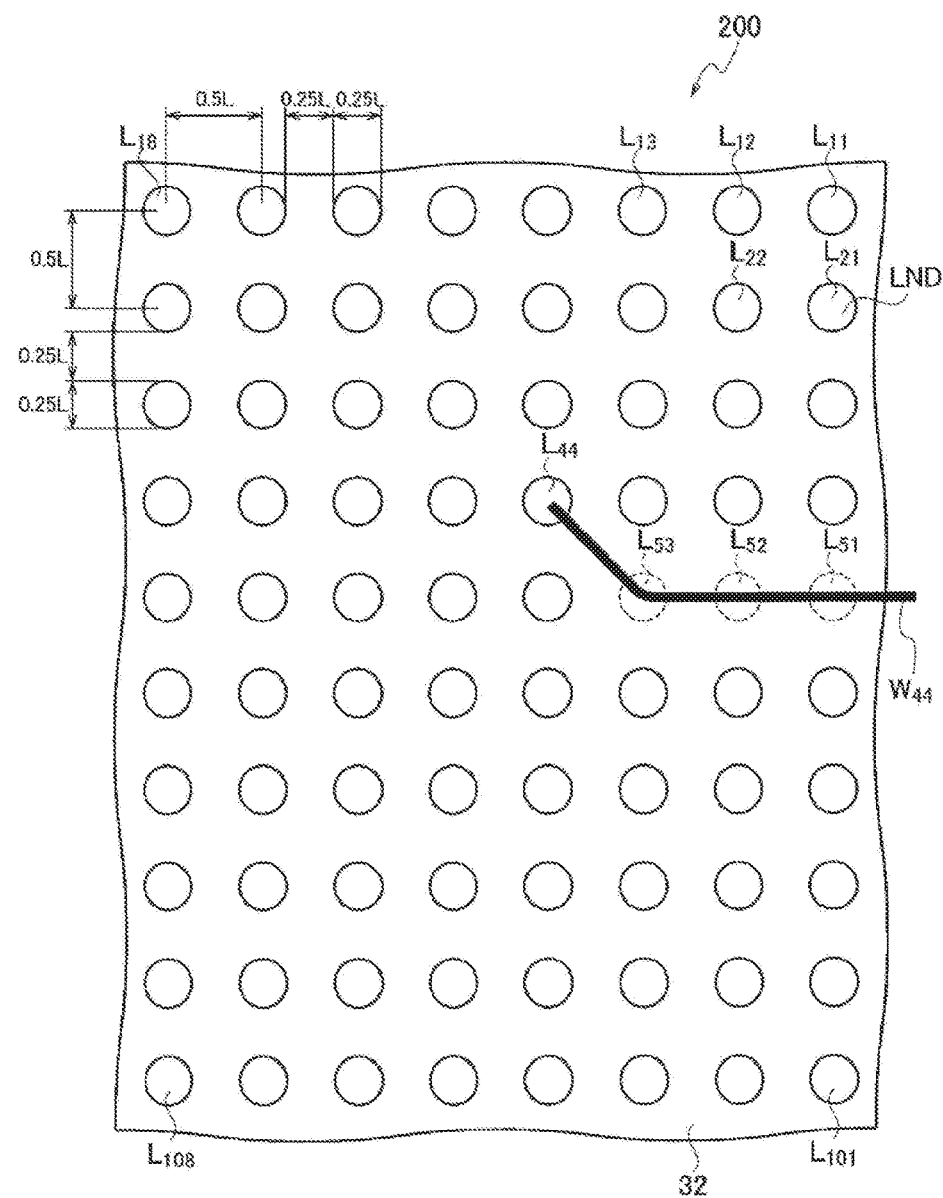
FIG. 22 is a planar pattern configuration view showing a land LND forming surface of a PCB substrate on which the semiconductor package shown in FIG. 21 is mounted.

FIG. 21 is a planar pattern configuration view of the semiconductor package 100 according to an embodiment, showing BGA in which 10×8 solder bumps BMP each having the diameter D of 0.25 L are arranged at a 2D (=0.5 L) pitch on a surface of a side on which the solder bumps BMP are formed. FIG. 22 is a planar pattern configuration view showing a land LND forming surface of the PCB substrate 200 on which the semiconductor package 100 shown in FIG. 21 is mounted.

As shown in FIG. 21, since the plurality of bumps BMP is arranged on a trajectory consisting of four hierarchies, i.e., rounds R1, R2, R3 and R4, balls BMP existing on a wiring path of an internal wiring connected to a land disposed in the inner side need be removed or be non-connected.

As one example, the balls BMP ($B_{51}$, $B_{52}$ and $B_{53}$) existing on a wiring path of the internal wiring $W_{44}$ connected to the land $L_{44}$ disposed in the inner side on the insulating substrate 32 are removed or non-connected to the rewiring layer MRD. In addition, the lands LND ($L_{51}$, $L_{52}$ and $L_{53}$) facing the balls BMP ($B_{51}$, $B_{52}$ and $B_{53}$) are removed or are non-connected.

Figure 23:
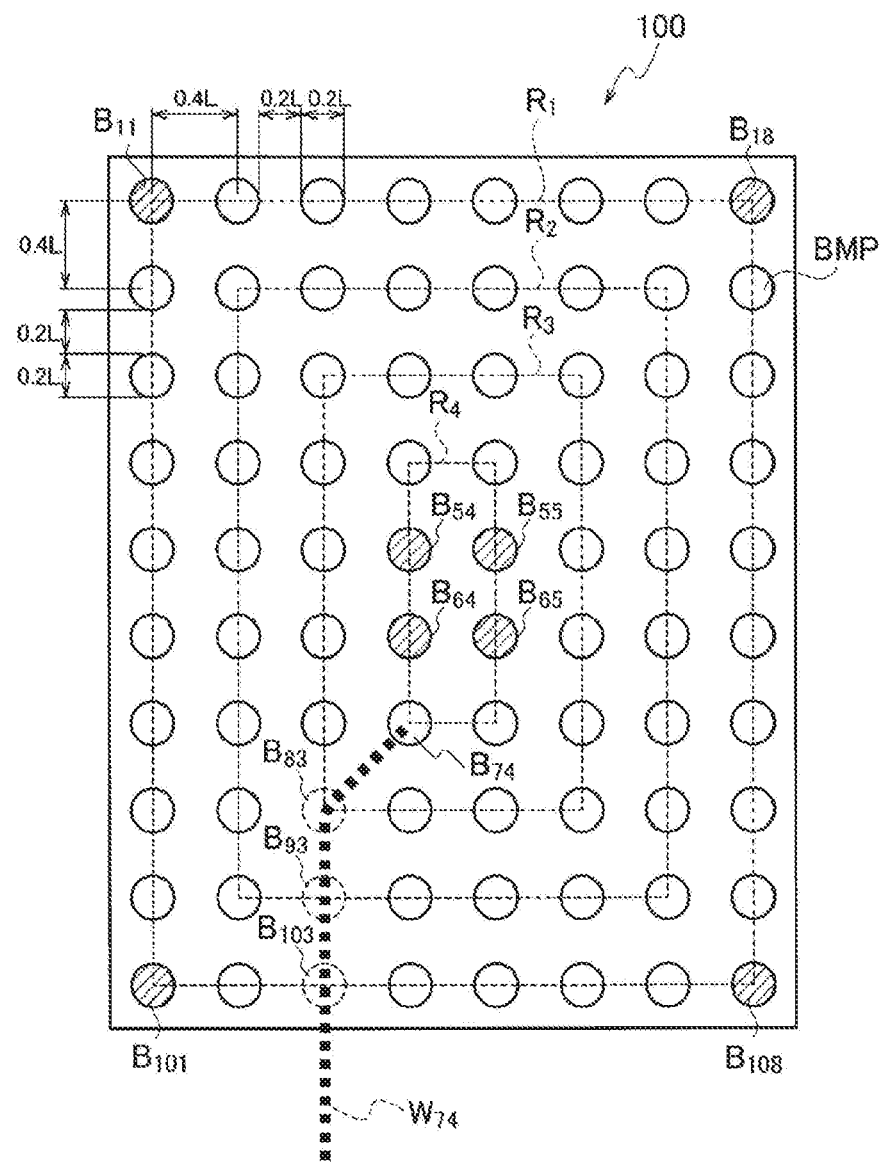
FIG. 23 is a planar pattern configuration view of a semiconductor package according to an embodiment, showing BGA in which 10×8 solder bumps BMP each having the diameter D of 0.2 L are arranged at a 2D (=0.4 L) pitch on a surface of a side on which solder bumps are formed.
Figure 24:
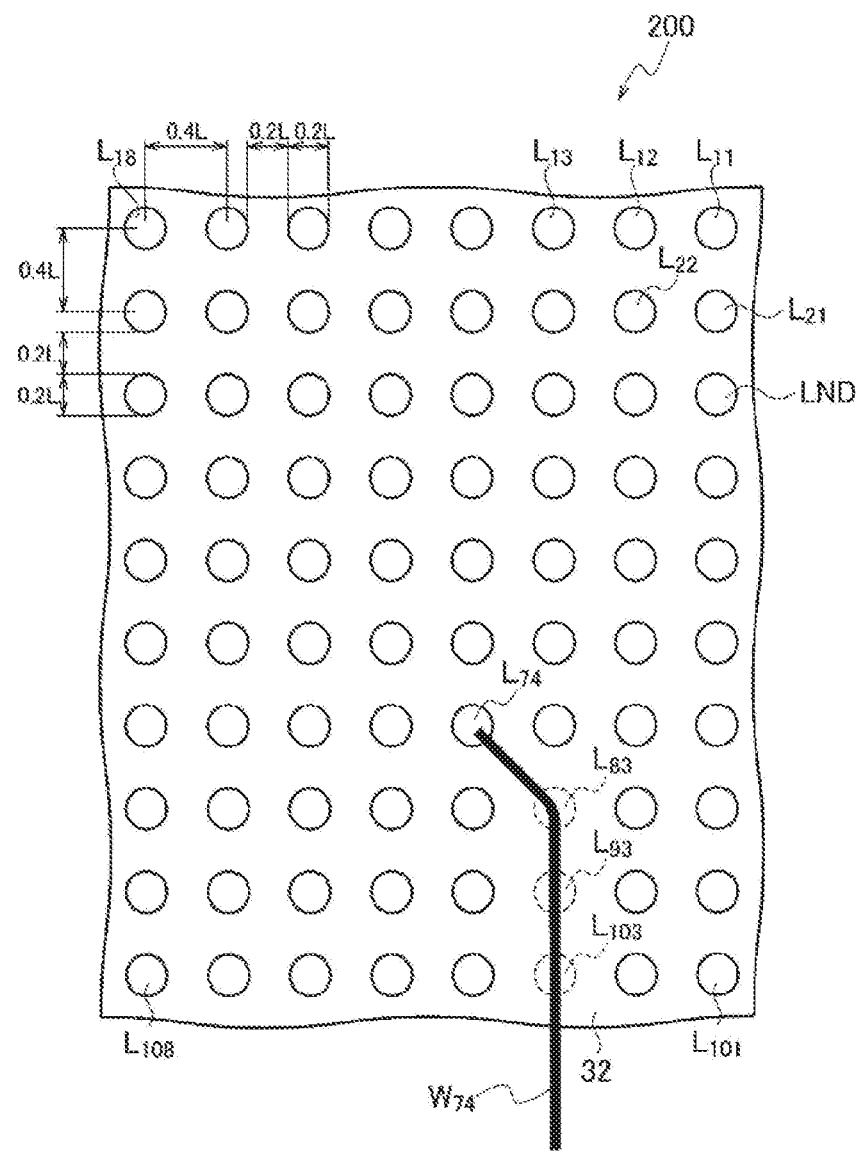
FIG. 24 is a planar pattern configuration view showing a land LND forming surface of a PCB substrate 200 on which the semiconductor package shown in FIG. 23 is mounted.

Similarly, FIG. 23 is a planar pattern configuration view of the semiconductor package 100 according to an embodiment, showing BGA in which 10×8 solder bumps BMP each having the diameter D of 0.2 L are arranged at a 2D (=0.4 L) pitch on a surface of a side on which the solder bumps BMP are formed. FIG. 24 is a planar pattern configuration view showing a land LND forming surface of the PCB substrate 200 on which the semiconductor package 100 shown in FIG. 23 is mounted.

As one example, the balls BMP ($B_{83}$, $B_{93}$ and $B_{103}$) existing on a wiring path of the internal wiring $W_{74}$ connected to the land $L_{74}$ disposed in the inner side on the insulating substrate 32 are removed or non-connected to the rewiring layer MRD. In addition, the lands LND ($L_{83}$, $L_{93}$ and $L_{103}$) facing the balls BMP ($B_{83}$, $B_{93}$ and $B_{103}$) are removed or are non-connected.

Figure 25:
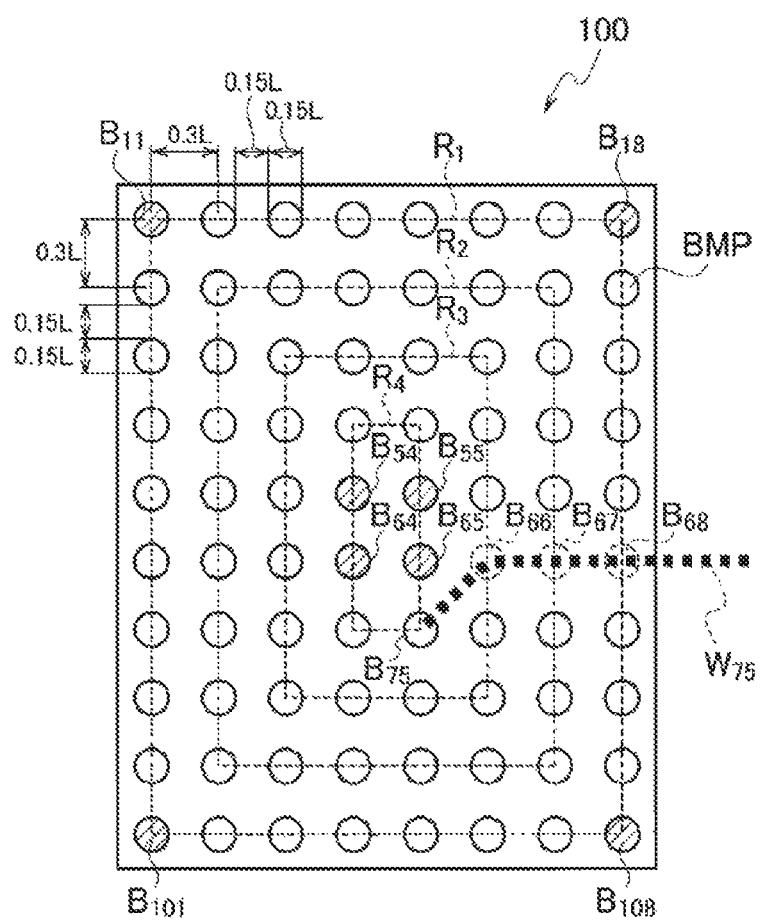
FIG. 25 is a planar pattern configuration view of a semiconductor device according to an embodiment, showing BGA in which 10×8 solder bumps BMP each having the diameter D of 0.15 L are arranged at a 2D (=0.3 L) pitch on a surface of a side on which the solder bumps BMP are formed.
Figure 26:
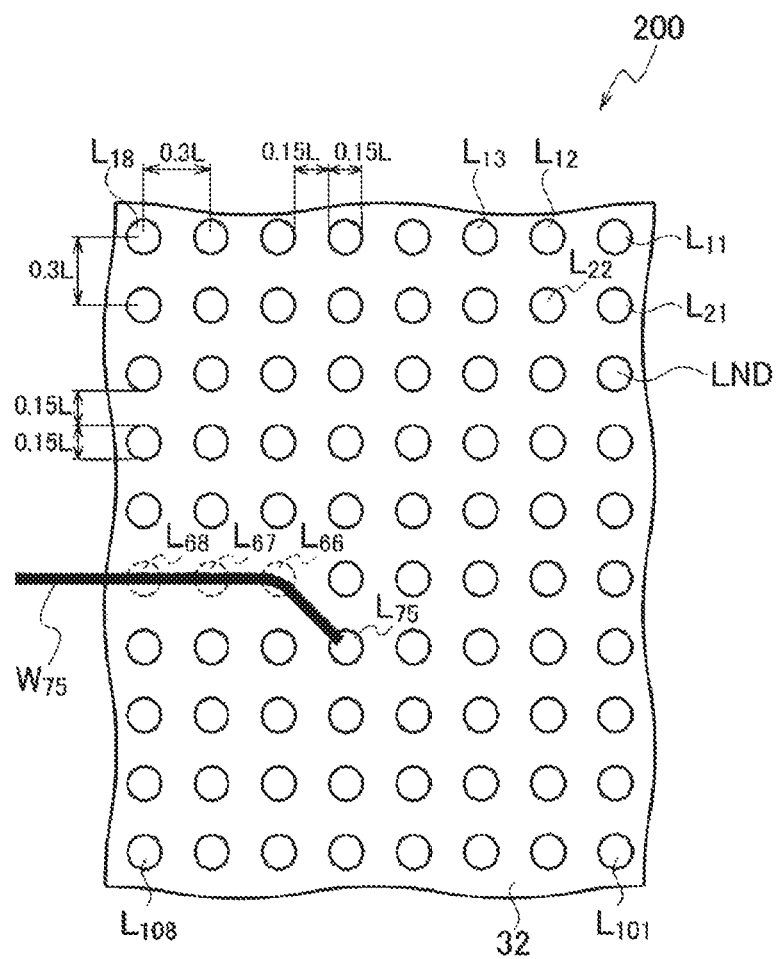
FIG. 26 is a planar pattern configuration view showing a land LND forming surface of a PCB substrate on which the semiconductor package shown in FIG. 25 according to an embodiment is mounted.

Similarly, FIG. 25 is a planar pattern configuration view of the semiconductor package 100 according to an embodiment, showing BGA in which 10×8 solder bumps BMP each having the diameter D of 0.15 L are arranged at a 2D (=0.3 L) pitch on a surface of a side on which the solder bumps BMP are formed. FIG. 26 is a planar pattern configuration view showing a land LND forming surface of the PCB substrate 200 on which the semiconductor package 100 shown in FIG. 25 is mounted.

As one example, the balls BMP ($B_{66}$, $B_{67}$ and $B_{68}$) existing on a wiring path of the internal wiring $W_{75}$ connected to the land $L_{75}$ disposed in the inner side on the insulating substrate 32 are removed or non-connected to the rewiring layer MRD. In addition, the lands LND ($L_{66}$, $L_{67}$ and $L_{68}$) facing the balls BMP ($B_{66}$, $B_{67}$ and $B_{68}$) are removed or are non-connected.

In any arrangements, the balls BMP ($B_{11}$, $B_{18}$, $B_{101}$, $B_{108}$, $B_{54}$, $B_{55}$, $B_{64}$ and $B_{65}$) arranged in the corners and central portion of the semiconductor package 100 are preferably left in order to secure connectivity with the PCB substrate 200. The semiconductor package 100 may be a wafer level chip size package.

(Reduction of Chip Size)

Figure 27A:
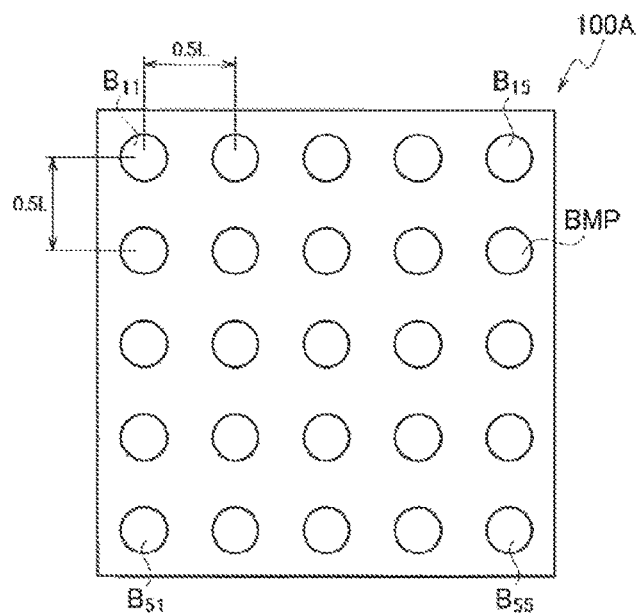
FIG. 27A is a planar pattern configuration view of a semiconductor package according to a comparative example, showing BGA in which 5×5 solder bumps BMP each having the diameter D of 0.25 L are arranged at a 2D (=0.5 L) pitch.
Figure 27B:
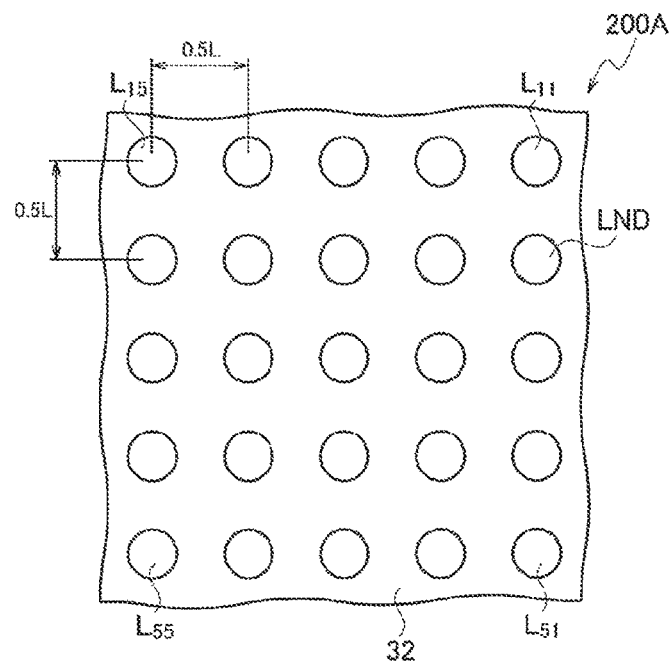
FIG. 27B is a planar pattern configuration view showing a land LND forming surface of a PCB substrate on which the semiconductor package shown in FIG. 27A according to the comparative example is mounted.

FIG. 27A is a planar pattern configuration view of the semiconductor package 100A according to a comparative example, showing BGA in which 5×5 solder bumps BMP each having the diameter D of 0.25 L are arranged at a 2D (=0.5 L) pitch. FIG. 27B is a planar pattern configuration view showing a land LND forming surface of the PCB substrate 200A on which the semiconductor package 100A shown in FIG. 27A is mounted. When the semiconductor package 100A is a wafer level chip size package, the chip size of the semiconductor integrated circuit 10 is substantially the same as the size of the semiconductor package 100A. Therefore, the chip size of the semiconductor integrated circuit 10 accommodated in the semiconductor package 100A according to the comparative example is equal to 2.5 L×2.5 L.

Figure 28:
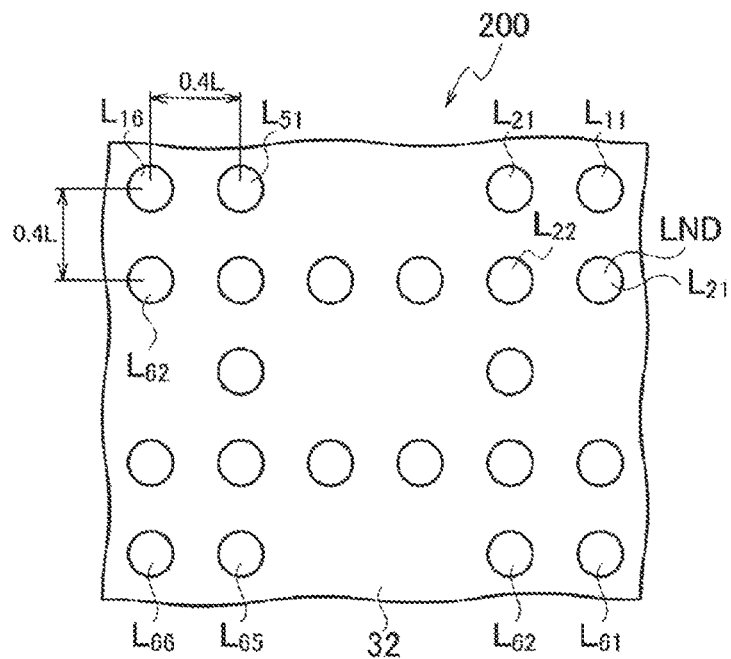
FIG. 28 is a planar pattern configuration view showing a land LND forming surface of a PCB substrate on which a semiconductor package according to an embodiment is mounted, with lands LND arranged at a 0.4 L pitch on the land LND forming surface.

FIG. 28 is a planar pattern configuration view showing a land LND forming surface of the PCB substrate 200 on which the semiconductor package 100 according to an embodiment is mounted, with lands LND each having the diameter D of 0.2 L arranged at a 2D (=0.4 L) pitch on the land LND forming surface. The chip size of the semiconductor integrated circuit 10 accommodated in the semiconductor package 100 disposed on the PCB substrate 200 shown in FIG. 28 is equal to 2.0 L×2.4 L.

When the pitch of the solder bumps BMP each having a diameter D of 0.25 L, is 0.5 L, since 22 pins are required, the chip size becomes at least 2.5 L×2.5 L and the wiring pitch may be 0.25 L singly. On the other hand, when the pitch of solder bumps BMP each having the diameter D of 0.2 L, is 0.4 L, the chip size can be reduced and the wiring pitch can meet the conditions of 0.25 L per pitch, as shown in FIG. 28. Therefore, the chip area can be reduced without having an effect on the PCB substrate cost. The minimum chip size at this time is 2.0 L×2.4 L which is reduced to about 23%.

Figure 29:
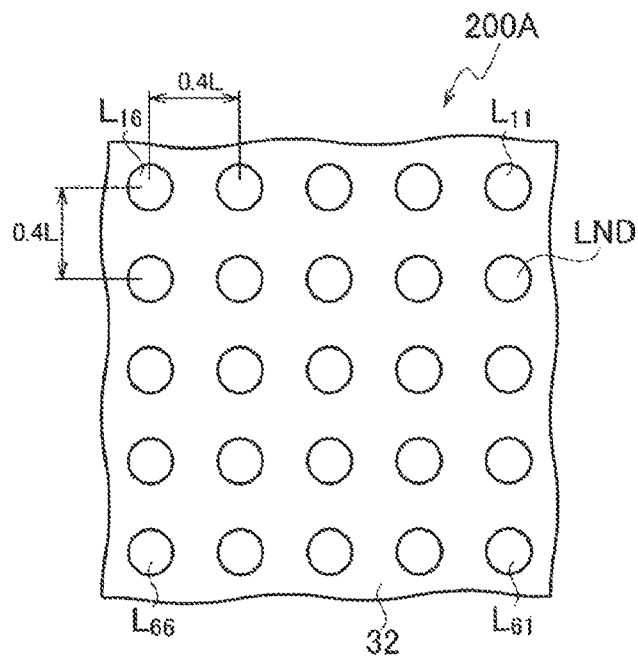
FIG. 29 is a planar pattern configuration view showing a land LND forming surface of a PCB substrate on which a semiconductor package according to a comparative example is mounted, with lands LND arranged at a 0.4 L pitch on the land LND forming surface.

FIG. 29 is a planar pattern configuration view showing a land LND forming surface of the PCB substrate 200A on which the semiconductor package 100A according to a comparative example is mounted, with lands LND each having the diameter D of 0.2 L arranged at a 2D (=0.4 L) pitch on the land LND forming surface. The chip size of the semiconductor integrated circuit 10 accommodated in the semiconductor package 100A disposed on the PCB substrate 200A shown in FIG. 29 is equal to 2.0 L×2.0 L.

Figure 30:
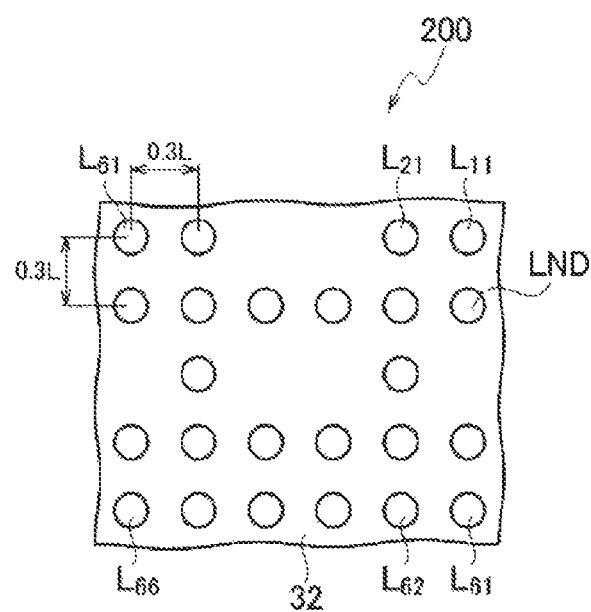
FIG. 30 is a planar pattern configuration view showing a land LND forming surface of a PCB substrate on which a semiconductor package according to an embodiment is mounted, with lands LND arranged at a 0.3 L pitch on the land LND forming surface.

FIG. 30 is a planar pattern configuration view showing a land LND forming surface of the PCB substrate 200 on which the semiconductor package 100 according to an embodiment is mounted, with lands LND each having the diameter D of 0.15 L arranged at a 0.3 L pitch on the land LND forming surface. The chip size of the semiconductor integrated circuit 10 accommodated in the semiconductor package 100 disposed on the PCB substrate 200 shown in FIG. 30 is equal to 1.5 L×1.8 L.

When the pitch of the solder bumps BMP each having a diameter D of 0.2 L, is 0.4 L, since 22 pins are required, the chip size becomes at least 2.0 L×2.0 L and the wiring pitch may be 0.2 L per pitch. On the other hand, when the pitch of the solder bumps BMP each having the diameter D of 0.15 L, is 0.3 L, the chip size can be reduced and the wiring pitch can meet the conditions of a 0.2 L per pitch, as shown in FIG. 30. Therefore, the chip area can be reduced without having an effect on PCB substrate cost. The minimum chip size at this time is 1.5 L×1.8 L and this reduces the size to about 32%.

In the semiconductor package 100 according to the embodiment, it is possible to alleviate the ball arrangement pitch rule and reduce the chip size of the semiconductor integrated circuit 10. That is, the ball arrangement pitch rule may be alleviated from 0.5 L to 0.4 L (L is an arbitrary constant). Alternatively, the ball arrangement pitch rule may be alleviated from 0.4 L to 0.3 L (L is an arbitrary constant).

On the other hand, the PCB substrate 200 on which the semiconductor package according to the embodiment can be easily mounted without requiring miniaturization of wiring width on the PCB substrate.

In addition, since the chip size of the semiconductor integrated circuit can be reduced, the semiconductor package can be downsized.

In the semiconductor package according to the embodiment, the PCB substrate on which the semiconductor package is mounted, and the semiconductor device including the PCB substrate and the semiconductor package mounted on the PCB substrate, when WL-CSP/BGA/LGA is mounted on the PCB substrate, balls corresponding to lands acting as necks to pass wirings on the PCB substrate are removed or made in non-contact (NC).

With the semiconductor package according to the embodiment, the land portion corresponding to the removed balls can be used as wirings on the PCB substrate, thereby narrowing a ball pitch and a land pitch corresponding to the balls. As a result, the chip size can be reduced. In addition, the land portion corresponding to the removed balls can also be removed, in which case the removed corresponding portion can be used as a space for wirings on the PCB substrate.

With the semiconductor package according to the embodiment, the land portion corresponding to the non-contacted balls can be used as wirings on the PCB substrate, thereby narrowing a ball pitch and a land pitch corresponding to the balls. As a result, the chip size can be reduced.

In addition, as for the wiring pitch, it is possible to secure a space of the same level as conventional, thereby preventing increase in PCB substrate cost, which can result in reduction in the entire system cost.

As described above, according to this embodiment, it is possible to provide a semiconductor package which is capable of reducing the chip size and eliminating a need to miniaturize the wiring width on a PCB substrate and can be easily mounted, a PCB substrate on which the semiconductor package is mounted, and a semiconductor device including the PCB substrate and the semiconductor package mounted on the PCB substrate.

The semiconductor package and semiconductor device of the present disclosure may be applied to WL-CSP type semiconductor devices, QNF package type semiconductor devices, and so on.

According to the present disclosure in some embodiments, it is possible to provide a semiconductor package which is capable of reducing the chip size and eliminating a need to miniaturize the wiring width on a PCB substrate and can be easily mounted, a PCB substrate on which the semiconductor package is mounted, and a semiconductor device including the PCB substrate and the semiconductor package mounted on the PCB substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
a semiconductor package including a first substrate having a first surface, one or more first wirings formed on the first surface of the first substrate, and a plurality of electrodes formed on the one or more first wirings; and
a second substrate having a first surface facing the first surface of the first substrate, the second substrate including second wirings respectively connected to the plurality of electrodes, the second wirings being formed on the first surface of the second substrate,
wherein, when viewed along a direction perpendicular to the first surface of the first substrate, the one or more first wirings and the second wirings are formed between the electrodes adjacent to each other such that the number of the one or more first wirings is smaller than the number of the second wirings, and a plurality of dummy electrodes, which is physically spaced apart from the one or more first wirings, is formed between the adjacent electrodes to overlap with the one or more first wirings.

2. The semiconductor device of claim 1, wherein between the adjacent electrodes when viewed along the direction perpendicular to the first surface of the first substrate, the one or more first wirings and the second wirings partially overlap.

3. The semiconductor device of claim 2, wherein between the adjacent electrodes when viewed along the direction perpendicular to the first surface of the first substrate, an area of the one or more first wirings not overlapping with the second wirings is larger than an area of the one or more first wirings overlapping with the second wirings.

4. The semiconductor device of claim 1, wherein between the adjacent electrodes when viewed along the direction perpendicular to the first surface of the first substrate, the one or more first wirings are interposed between two or more of the second wirings.

5. The semiconductor device of claim 1, wherein the one or more first wirings and the second wirings are spaced apart from each other when viewed along the direction perpendicular to the first surface of the first substrate.

6. The semiconductor device of claim 5, wherein between the adjacent electrodes when viewed along the direction perpendicular to the first surface of the first substrate, the one or more first wirings are interposed between two or more second wirings.

7. The semiconductor device of claim 1, wherein an insulating layer is formed between the one or more first wirings and the plurality of dummy electrodes.

8. The semiconductor device of claim 1, wherein the plurality of electrodes is arranged in a form of a lattice when viewed along the direction perpendicular to the first surface of the first substrate.

9. The semiconductor device of claim 8, wherein the lattice is one of a square lattice, a rectangular lattice, a triangular lattice and a hexagonal lattice.

10. The semiconductor device of claim 1, wherein an arrangement pitch rule of the plurality of electrodes is allowed to be alleviated to reduce a chip size of a semiconductor integrated circuit accommodated in the semiconductor package.

11. The semiconductor device of claim 10, wherein the arrangement pitch rule of the plurality of electrodes is alleviated from 0.5 L to 0.4 L (L is an arbitrary constant).

12. The semiconductor device of claim 10, wherein the arrangement pitch rule of the plurality of electrodes is alleviated from 0.4 L to 0.3 L (L is an arbitrary constant).

13. The semiconductor device of claim 1, wherein the electrodes arranged in corners and a central portion of the semiconductor package are not removed so that connectivity with the second substrate is secured.

14. The semiconductor device of claim 1, wherein a part of distances between adjacent second wirings is same.

15. The semiconductor device of claim 1, wherein between the adjacent electrodes when viewed along the direction perpendicular to the first surface of the first substrate, centers of the one or more first wirings and centers of the second wirings deviate from each other.

16. The semiconductor device of claim 15, wherein the semiconductor package has a pair of first sides facing each other when viewed along the direction perpendicular to the first surface of the first substrate and a pair of second sides facing each other when viewed along the direction perpendicular to the first surface of the first substrate, the second sides being shorter than the first sides, and wherein the plurality of electrodes is arranged in a plurality of electrode rows along an elongate direction of the first sides, and in at least two electrode rows, a region where the centers of the one or more first wirings and the centers of the second wirings deviate from each other when viewed along the direction perpendicular to the first surface of the first substrate is interposed between the adjacent electrodes.

* * * * *